US012765336B2

(12) United States Patent
Shackleton et al.

(10) Patent No.: US 12,765,336 B2
(45) Date of Patent: Oct. 13, 2026

(54) PLANARIZATION SYSTEM, PLANARIZING METHOD, AND METHOD OF MANUFACTURING AN ARTICLE

(71) Applicant: CANON KABUSHIKI KAISHA, Tokyo (JP)

(72) Inventors: Steven C. Shackleton, Austin, TX (US); Seth J. Bamesberger, Austin, TX (US); Byung-Jin Choi, Austin, TX (US)

(73) Assignee: CANON KABUSHIKI KAISHA, Tokyo (JP)

( * ) Notice: Subject to any disclaimer, the term of this patent is extended or adjusted under 35 U.S.C. 154(b) by 495 days.

(21) Appl. No.: 18/341,290

(22) Filed: Jun. 26, 2023

(65) Prior Publication Data

US 2024/0429060 A1 Dec. 26, 2024

(51) Int. Cl.
*H10P 95/00* (2026.01)
*H10P 14/60* (2026.01)

(52) U.S. Cl.
CPC .......... *H10P 95/06* (2026.01); *H10P 14/6346* (2026.01); *H10P 14/6538* (2026.01)

(58) Field of Classification Search
CPC ... H10P 95/06; H10P 14/6538; H10P 14/6346
See application file for complete search history.

(56) References Cited

U.S. PATENT DOCUMENTS 5,711,647 A 1/1998 Slocum
5,851,102 A 12/1998 Okawa et al.
6,948,898 B2 9/2005 Berger et al.
10,319,623 B2 * 6/2019 Matsuhira ............... H10P 72/78
10,411,062 B2 9/2019 Kim et al.
11,043,407 B2 6/2021 Choi et al.
11,145,535 B2 * 10/2021 Choi ................... H10P 72/7624
11,367,702 B2 6/2022 Tanabe
2010/0071847 A1 3/2010 Shin et al.
2010/0133735 A1 * 6/2010 Katsuta .................. B23Q 3/088 269/21
2020/0339828 A1 10/2020 Li et al.
2020/0381283 A1 12/2020 Huang et al.
2022/0011342 A1 1/2022 Kiyokawa et al.

FOREIGN PATENT DOCUMENTS

WO 2022/161636 A1 8/2022

* cited by examiner

*Primary Examiner* — Michael P Wieczorek
(74) *Attorney, Agent, or Firm* — Canon U.S.A., IP Division

(57) ABSTRACT

A planarizing method includes dispensing formable material onto a substrate, positioning the substrate relative to a substrate chuck by contacting the substrate with a first protrusion of an engagement mechanism, the engagement mechanism being disposed adjacent the substrate chuck, contacting a superstrate held by a superstrate chuck with the formable material, thereby forming a film of formable material between the superstrate and the substrate, curing the film of formable material to form a cured layer between the superstrate and the substrate, and initiating a separation front between the cured layer and the superstrate by contacting the superstrate with a second protrusion of the engagement mechanism.

19 Claims, 24 Drawing Sheets

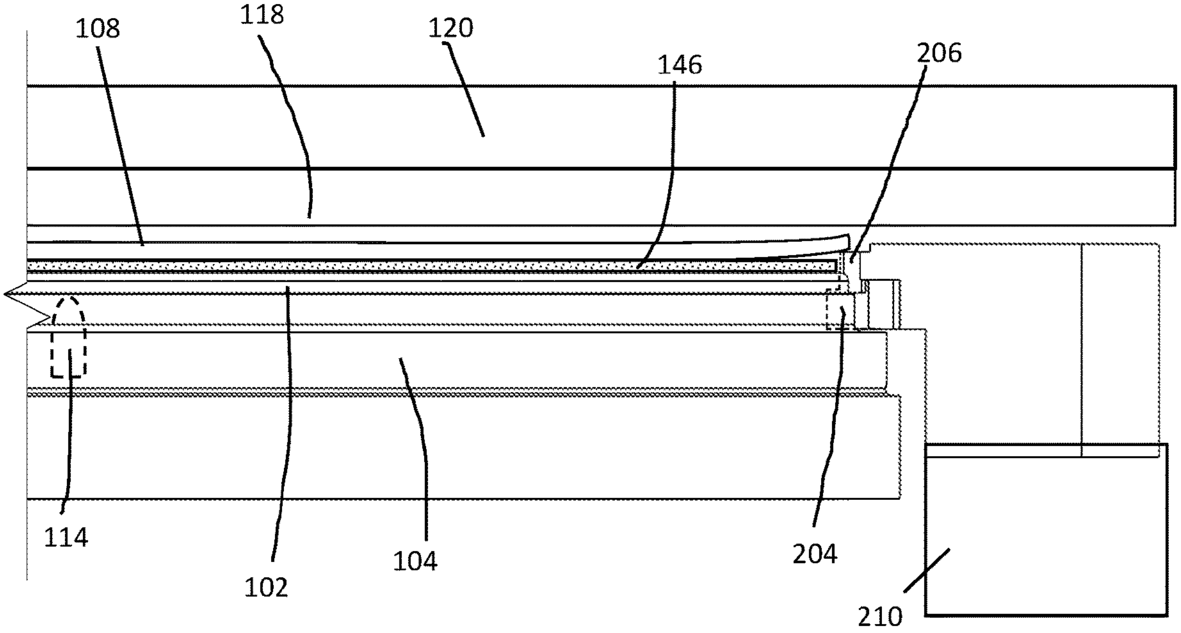
Fig. 25
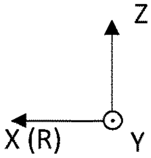

PLANARIZATION SYSTEM, PLANARIZING METHOD, AND METHOD OF MANUFACTURING AN ARTICLE

BACKGROUND

Field of Art

The present disclosure relates to substrate processing, and more particularly, to planarization systems and planarization methods for planarizing surfaces in semiconductor fabrication.

Description of the Related Art

Planarization and imprinting techniques are useful in fabricating semiconductor devices. For example, the process for creating a semiconductor device includes repeatedly adding and removing material to and from a substrate. This process can produce a layered substrate with an irregular height variation (i.e., topography), and as more layers are added, the substrate height variation can increase. The height variation has a negative impact on the ability to add further layers to the layered substrate. Separately, semiconductor substrates (e.g., silicon wafers) themselves are not always perfectly flat and may include an initial surface height variation (i.e., topography). One method of addressing this issue is to planarize the substrate between layering steps. Various lithographic patterning methods benefit from patterning on a planar surface. In ArFi laser-based lithography, planarization reduces the impact of depth of focus (DOF) limitations, and improves critical dimension (CD), and critical dimension uniformity. In extreme ultraviolet lithography (EUV), planarization improves feature placement and reduces the impact of DOF limitations. In nanoimprint lithography (NIL) planarization improves feature filling and CD control after pattern transfer.

A planarization technique sometimes referred to as inkjet-based adaptive planarization (IAP) involves dispensing a variable drop pattern of polymerizable material between the substrate and a superstrate, where the drop pattern varies depending on the substrate topography. A superstrate is then brought into contact with the polymerizable material after which the material is polymerized on the substrate, and the superstrate removed. Improvements in planarization techniques, including IAP techniques, are desired for improving, e.g., whole wafer processing and semiconductor device fabrication.

Certain steps in a planarization method include a step of positioning a substrate on a substrate chuck and a later step of separating a superstrate from a cured layer. In certain planarization systems, there are complex methods and devices for positioning the substrate at the substrate chuck. Some systems also have a pin for assisting in separating the superstrate from the cured layer. However, there is a need in the art for an improved planarization system having a device that is able to assist in positioning the substrate relative to the substrate chuck that and is also able to assist in separating the superstrate from the cured layer.

SUMMARY

A planarization system comprises a superstrate chuck configured to hold a superstrate, a substrate chuck configured to hold a substrate, and an engagement mechanism adjacent the substrate chuck. The engagement mechanism includes a body, a first protrusion extending from the body in a radial direction toward a center of the substrate chuck, and a second protrusion extending from the body in the radial direction toward the center of the substrate chuck. The first protrusion extends farther in the radial direction toward the center of the substrate chuck than the second protrusion. The second protrusion overlaps a portion of the first protrusion in a direction perpendicular to the radial direction.

A planarization method comprises dispensing formable material onto a substrate, positioning the substrate relative to a substrate chuck by contacting the substrate with a first protrusion of an engagement mechanism, the engagement mechanism being disposed adjacent the substrate chuck, contacting a superstrate held by a superstrate chuck with the formable material, thereby forming a film of formable material between the superstrate and the substrate, curing the film of formable material to form a cured layer between the superstrate and the substrate, and initiating a separation front between the cured layer and the superstrate by contacting the superstrate with a second protrusion of the engagement mechanism.

A method of manufacturing an article comprises dispensing a formable material on a substrate, positioning the substrate relative to a substrate chuck by contacting the substrate with a first protrusion of an engagement mechanism, the engagement mechanism being disposed adjacent the substrate chuck, contacting a superstrate held by a superstrate chuck with the formable material, thereby forming a film of formable material between the superstrate and the substrate, curing the film of formable material to form a cured layer between the superstrate and the substrate, initiating a separation front between the cured layer and the superstrate by contacting the superstrate with a second protrusion of the engagement mechanism, fully separating the superstrate from the cured layer, and processing the cured formable material to make the article.

These and other objects, features, and advantages of the present disclosure will become apparent upon reading the following detailed description of exemplary embodiments of the present disclosure, when taken in conjunction with the appended drawings, and provided claims.

BRIEF DESCRIPTION OF DRAWINGS

So that features and advantages of the present disclosure can be understood in detail, a more particular description of embodiments of the disclosure may be had by reference to the embodiments illustrated in the appended drawings. It is to be noted, however, that the appended drawings only illustrate typical embodiments of the disclosure and are therefore not to be considered limiting of its scope, for the disclosure may admit to other equally effective embodiments.

FIG. 25 is a partial side view of the substrate chuck and the engagement mechanism when the engagement mechanism has been elevated to assist in separating the superstrate from the cured layer, in accordance with an aspect of the present disclosure.

While the subject disclosure will now be described in detail with reference to the figures, it is done so in connection with the illustrative exemplary embodiments. It is intended that changes and modifications can be made to the described exemplary embodiments without departing from the true scope and spirit of the subject disclosure as defined by the appended claims.

DETAILED DESCRIPTION

Planarization System

Figure 1:
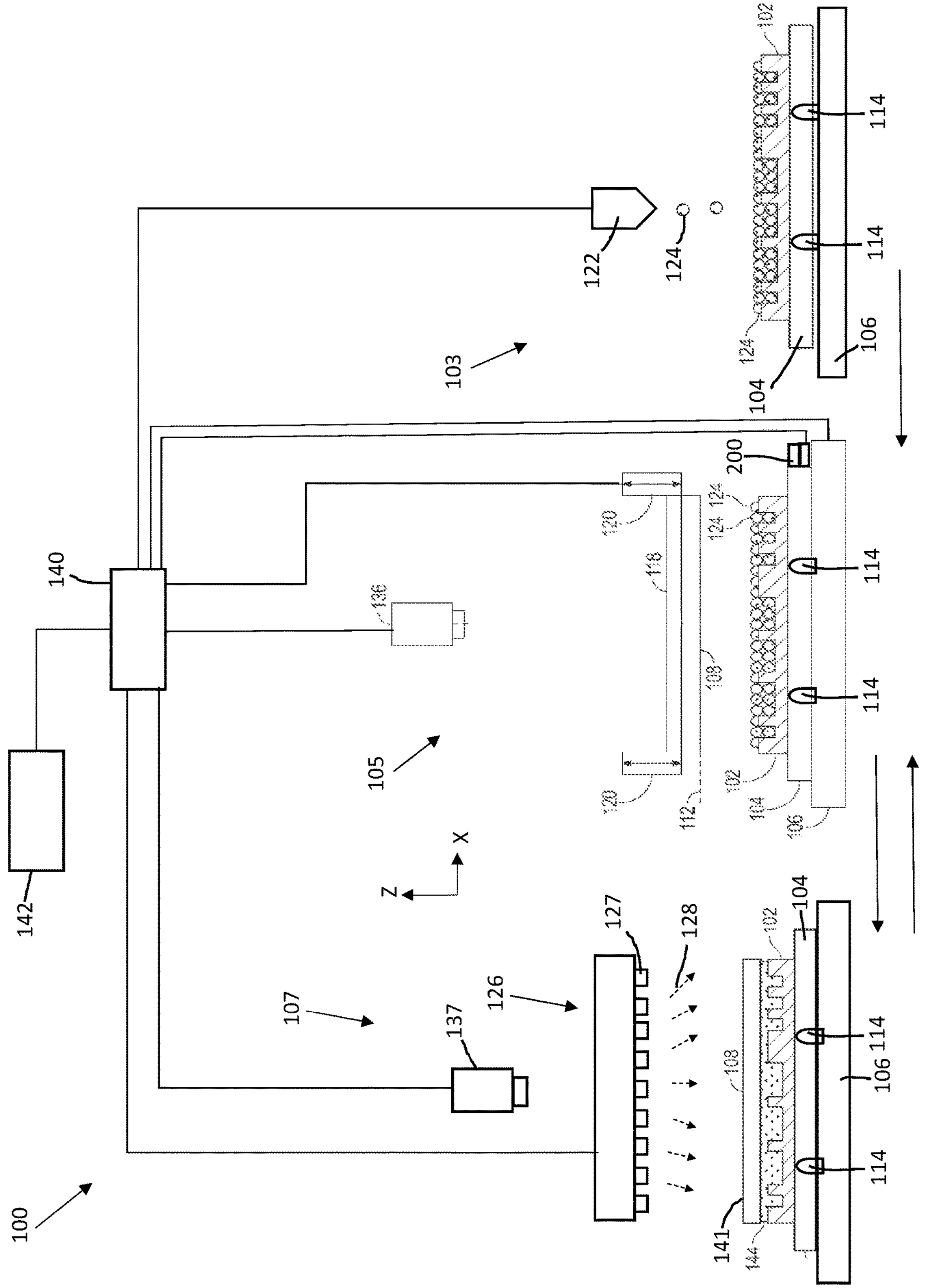
FIG. 1 is a schematic diagram illustrating an example planarization system in accordance with an aspect of the present disclosure.

FIG. 1 illustrates an example system for shaping a surface in accordance with an aspect of the present disclosure. The system for shaping a surface may be, for example, a planarization system or an imprint system. The example embodiment described herein is a planarization system 100. However, the concepts are also applicable to an imprint system. Thus, while the terminology throughout this disclosure is primarily focused on planarization, it should be understood that the disclosure is also applicable to the corresponding terminology of an imprint context.

The planarization system 100 is used to planarize a film on a substrate 102. In the case of an imprint system, the imprint system is used to form a pattern on the film on the substrate. The substrate 102 may be coupled to a substrate chuck 104. The substrate chuck 104 may be but is not limited to a vacuum chuck, pin-type chuck, groove-type chuck, electrostatic chuck, electromagnetic chuck, and/or the like.

The substrate 102 and the substrate chuck 104 may be further supported by a substrate positioning stage 106. The substrate positioning stage 106 may provide translational and/or rotational motion along one or more of the x-, y-, z-, θ-, ψ, and φ-axes. The substrate positioning stage 106, the substrate 102, and the substrate chuck 104 may also be positioned on a base (not shown). The substrate positioning stage may be a part of a positioning system.

As shown in FIG. 1, in an example embodiment, the planarization system 100 may include three separate stations: a dispensing station 103, a planarizing station 105, and a curing station 107. The three stations may be located at different locations. A positioning system may be capable transferring the substrate 102 to each of the three stations. In some instances, a stage 106 may participate in the movement of the substrate 102. The positioning system may include articulating arms and a hand 130 (FIG. 6) coupled with one of the articulating arms. The hand is also known as an end effector. By using the articulating arms and the hand 130, the positioning system is able to pick up and place the substrate on a substrate chuck. In the example embodiments discussed below, the planarizing station 105 is located at a first location and the dispensing station 103 is located at a second location that is different from the first location. In these example embodiments the substrate 102 is carried from the dispensing station 103 to the planarizing station 105 using the positioning system. Each of the stations may include mounting pins 114 that are configured to lift the substrate 102 from the substrate chuck 104.

The dispensing station 103 of the planarization system 100 may comprise a fluid dispenser 122. The fluid dispenser 122 may be used to deposit droplets of liquid formable material 124 (e.g., a photocurable polymerizable material) onto the substrate 102 with the volume of deposited material varying over the area of the substrate 102 based on at least in part upon its topography profile. The formable material may be a photocurable composition comprising a photoinitiator and monomers. Exemplar monomers which may be in the photocurable composition include: acrylate monomers; vinyl monomers; styrenic monomers; etc. The formable material may have the composition described in U.S. Pat. App. Pub. No. 2020/0339828, which is hereby expressly incorporated by reference herein. As discussed in U.S. Pat. App. Pub. No. 2020/0339828, the formable material may be a photocurable composition comprising a polymerizable material and a photoinitiator, wherein at least 90 wt % of the polymerizable material may comprise acrylate monomers including an aromatic group. The photocurable composition can have a viscosity of not greater than 10, 15, 20, or 30 mPa·s, the total carbon content of the photocurable composition after curing can be at least 73%, and the Ohnishi number may be not greater than 3.0. At least 90 wt % of the polymerizable material can include monomers containing an aromatic group in their chemical structure. Some non-limiting examples of monomers comprising an aromatic group can be: benzyl acrylate (BA), benzyl methacrylate (BMA), 1-naphthyl methacrylate (1-NMA), bisphenol A dimethacrylate (BPADMA), 1-naphthyl acrylate (1-NA), 2-naphthyl acrylate (2-NA), 9,9-bis [4-(2-acryloyloxy ethoxy) phenyl]fluorine (A-BPEF), 9-fluorene methacrylate (9-FMA), 9-fluorene acrylate (9-FA), o-phenylbenzyl acrylate (o-PBA), bisphenol A diacrylate (BPADA), propenoic acid, 1,1'-[1,1'-binaphthalene]-2,2'-diyl ester (BNDA), styrene, divinyl benzene (DVB). Further details of the composition may be found in U.S. Pat. App. Pub. No. 2020/0339828. Some non-limiting examples of suitable monofunctional (meth) acrylates to be included in the polymerizable material are: isobornyl acrylate; 3,3,5-trimethylcyclohexyl acrylate; dicyclopentenyl acrylate; dicyclopentanyl acrylate; dicyclopentenyl oxyethyl acrylate; benzyl acrylate; naphthyl acrylate; 2-phenylethyl acrylate; 2-phenoxyethyl acrylate; phenyl acrylate; (2-ethyl-2-methyl-1,3-dioxolan-4-yl) methyl acrylate; o-phenyl benzyl acrylate; butyl acrylate; ethyl acrylate; methyl acrylate; n-hexyl acrylate; 2-ethyl hexyl acrylate; 4-tert-butylcyclohexyl acrylate; methoxy polyethylene glycol (350) monoacrylate; 2-methoxyethyl acrylate; lauryl acrylate; stearyl acrylate; 9-fluorene acrylate. Some non-limiting examples of suitable diacrylates to be included in the polymerizable material are: ethylene glycol diacrylate; diethylene glycol diacrylate; triethylene glycol diacrylate; tetraethylene glycol diacrylate; 1,2-propanediol diacrylate; dipropylene glycol diacrylate; tripropylene glycol diacrylate; polypropylene glycol diacrylate; 1,3-propanediol diacrylate; 1,4-butanediol diacrylate; 2-butene-1,4-diacrylate; 1,3-butylene glycol diacrylate; 3-methyl-1,3-butanediol diacrylate; 1,5-pentanediol diacrylate; 3-Methyl-1,5-pentanediol diacrylate; neopentyl glycol diacrylate; tricyclodecane dimethanol diacrylate; 1,6-hexanediol diacrylate; 1,9-nonanediol diacrylate; 1,10-decanediol diacrylate; 1,12-dodecanediol diacrylate; cyclohexane dimethanol diacrylate; bisphenol A diacrylate; ethoxylated bisphenol A diacrylate; m-xylylene diacrylate; 9,9-bis [4-(2-acryloyloxy ethoxy) phenyl] fluorine; 2,2'-diacrylate-1,1'-binaphthalene; dicyclopentanyl diacrylate; 1,2-adamantanediol diacrylate; 2,4-diethylpentane-1,5-diol diacrylate; poly (ethylene glycol) diacrylate; 1,6-hexanediol (EO)2 diacrylate; 1,6-hexanediol (EO)5 diacrylate; and alkoxylated aliphatic diacrylate esters. Some non-limiting examples of suitable multifunctional acrylates to be included in the polymerizable material are: trimethylolpropane triacrylate; propoxylated trimethylolpropane triacrylate (e.g., propoxylated (3) trimethylolpropane triacrylate, propoxylated (6) trimethylolpropane triacrylate); trimethylolpropane ethoxylate triacrylate (e.g., n~1.3,3,5); di (trimethylolpropane) tetraacrylate; propoxylated glyceryl triacrylate (e.g., propoxylated (3) glyceryl triacrylate); 1,3,5-adamantanetriol triacrylate; tris (2-hydroxy ethyl) isocyanurate triacrylate; pentaerythritol triacrylate; Trisphenol PA triacrylate; pentaerythritol tetracrylate; ethoxylated pentaerythritol tetracrylate; dipentaerythritol pentaacrylate; tripentaerythritol octaacrylate; trimethylolpropane (PO) n triacrylate (n is 1, 2, 3 . . . ); trimethylolpropane (EO) n triacrylate (n is 1, 2, 3 . . . ). Examples of the vinyl benzene type of monomers include vinylbenzene (styrene), divinylbenzene (DVB), trivinylbenzene (TVB), 3,3'-divinylbiphenyl, 3,4',5-trivinylbiphenyl, 3,3',5,5'-tetravinylbiphenyl, 1,2-bis (3-vinylphenyl) ethane, bis (4-vinylphenyl) ether, bis (3-vinylphenyl) ether. Some non-limiting examples of suitable multifunctional monomers to be included in the polymerizable material are: molecules containing both acrylate functional groups and vinyl groups directly connected to aromatic rings. For example, 3-vinyl benzyl acrylate, 2-(4-vinyl)-phenyl, 1,3-propane diacrylate, 3,5-bivinyl benzyl acrylate, and 5-vinyl, 1,3-xylene diacrylate. Some non-limiting examples of maleimides and bismaleimides to be included in the polymerizable material are: N-benzylmaleimide; N-cyclohexylmaleimide; N-phenylmaleimide; and bis (3-ethyl-5-methyl-4-maleimidophenyl) methane. Some non-limiting examples of suitable benzoxazines to be included in the polymerizable material are: 6,6'-Methylenebis [3,4-dihydro-3-phenyl-2H-1,3-benzoxazine; and 3,3'-(Methylenedi-4,1-phenylene) bis [3,4-dihydro-2H-1,3-benzoxazine.

Different fluid dispensers 122 may use different technologies to dispense the formable material 124. When the formable material 124 is jettable, ink jet type dispensers may be used to dispense the formable material. For example, thermal ink jetting, microelectromechanical systems (MEMS) based ink jetting, valve jet, and piezoelectric ink jetting are common techniques for dispensing jettable liquids. Because the substrate 102 is brought to the dispensing station 103, and because the dispensing station 103 is a different location than the planarizing station 105, the fluid dispensers 122 may be stationary. In another embodiment the fluid dispensers 122 may be movable.

As shown in FIG. 1, the planarizing station 105 may include a superstrate 108, having a working surface 112 facing and spaced apart from the substrate 102. The superstrate 108 may be formed from materials including, but not limited to, fused silica, quartz, silicon, organic polymers, siloxane polymers, borosilicate glass, fluorocarbon polymers, metal, hardened sapphire, and/or the like. In an embodiment the superstrate 108 is readily transparent to UV light radiation. The surface 112 is generally of the same areal size as or slightly larger than the surface of the substrate 102.

The planarizing station 105 may further include a superstrate chuck 118 and a planarization head 120. The superstrate 108 may be coupled to or retained by the superstrate chuck 118. The superstrate chuck 118 may be coupled to the planarization head 120. The planarization head 120 may be movably coupled to a bridge. The planarization head 120 may include one or more actuators such as voice coil motors, piezoelectric motors, linear motor, nut and screw motor, etc., which are configured to move the superstrate chuck 118 relative to the substrate 102 in at least the z-axis direction, and potentially other directions (e.g., x-, y-, θ-, ψ-, and φ-axis). In operation, either the planarization head 120, the substrate positioning stage 106, or both vary a distance between the superstrate 108 and the substrate 102 to define a desired space (a bounded physical extent in three dimensions) that is filled with the formable material 124. For example, the planarization head 120 may be moved toward the substrate and may apply a force to the superstrate 108 such that the superstrate 108 contacts and spreads droplets of the formable material 124 as further detailed herein. In the case the shaping station being an imprinting station, the plate chuck is a template chuck.

The planarizing station 105 may further comprise a camera 136 positioned to view the spread of formable material 124 as the superstrate 108 contacts the formable material 124 during the planarizing process. The camera 136 may include one or more of a CCD, a sensor array, a line camera, and a photodetector which are configured to gather light at a wavelength that shows a contrast between regions underneath the superstrate 108 and in contact with the formable material 124 and regions underneath the superstrate 108 but not in contact with the formable material 124. The camera 136 may be configured to provide images of the spread of formable material 124 underneath the superstrate 108, and/or the separation of the superstrate 108 from cured formable material 124. The camera 136 may also be configured to measure interference fringes, which change as the formable material 124 spreads between the gap between the surface 112 and the substrate surface.

As noted above, the curing station 107 may be located at a different location than the planarizing station 105. In another embodiment the curing may be implemented at the planarizing station 105 such that there is not a separate curing station. In the case of there being a separate curing station 107, following the forming of the formable material film 144 at the planarizing station 105, the substrate 102 having a formable material film 144 and the superstrate 108 thereon, will travel to the curing station 107. The curing station 107 includes a radiation source 126 that directs actinic energy, for example, UV light radiation, along an exposure path 128. In an example embodiment the radiation source 126 comprises an array of light emitting diodes (LEDs) 127. The array of LEDs 127 may be configured such that the emitted light is distributed at 80% or greater uniformity across the substrate 102. The wavelength of the light emitted may be 300 to 400 nm. The substrate 102 and the superstrate 108, with the formable material film 144 in between, may be positioned in superimposition with the exposure path 128. The array of LEDs 127 transmits the actinic energy along the exposure path 128. In this manner, the actinic energy is uniformly applied to the formable material film 144. In the example embodiment where the curing occurs at the curing station 107, the system does not include (is free from) additional optical components (e.g., dichroic mirrors, beam combiners, prisms, lenses, mirrors, etc.). However, in an embodiment where the curing is implemented at the same location as the planarizing station, such optical components may be included to direct the energy to the formable material. The curing station 107 may further include a separate camera 137 for data collection and monitoring with respect to the curing process. In an embodiment where the curing features are implemented at the same location as the planarizing station, the camera 136 may be used to monitor curing.

The planarization system 100 may be regulated, controlled, and/or directed by one or more processors 140 (controller) in communication with one or more components and/or subsystems such as the substrate chuck 104, the substrate positioning stage 106, the positioning system, the superstrate chuck 118, the fluid dispenser 122, the planarization head 120, the camera 136, the radiation source 126, and/or the camera 137. The processor 140 may operate based on instructions in a computer readable program stored in a non-transitory computer memory 142. The processor 140 may be or include one or more of a CPU, MPU, GPU, ASIC, FPGA, DSP, and a general-purpose computer. The processor 140 may be a purpose-built controller or may be a general-purpose computing device that is adapted to be a controller. Examples of a non-transitory computer readable memory include but are not limited to RAM, ROM, CD, DVD, Blu-Ray, hard drive, networked attached storage (NAS), an intranet connected non-transitory computer readable storage device, and an internet connected non-transitory computer readable storage device. All of the method steps described herein may be executed by the processor 140.

Planarization Process

Figure 2A:
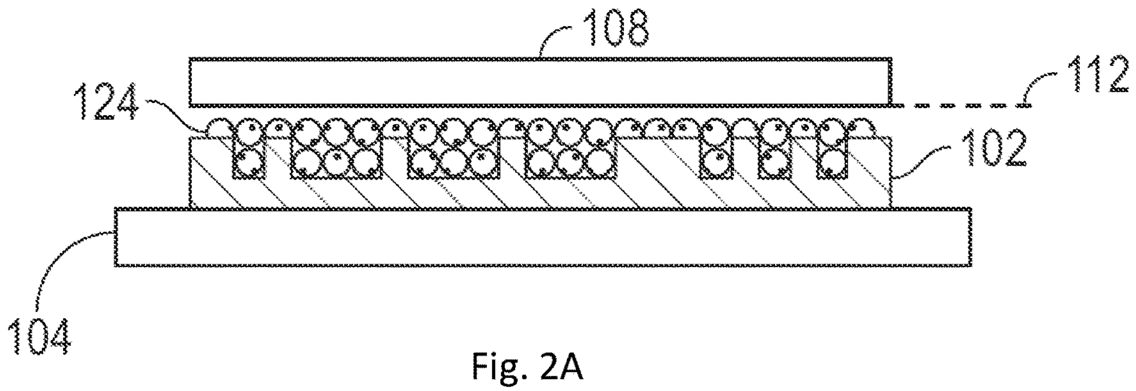
FIGS. 2A to 2C illustrate a schematic cross section of an example planarization process in accordance with an aspect of the present disclosure.
Figure 2B:
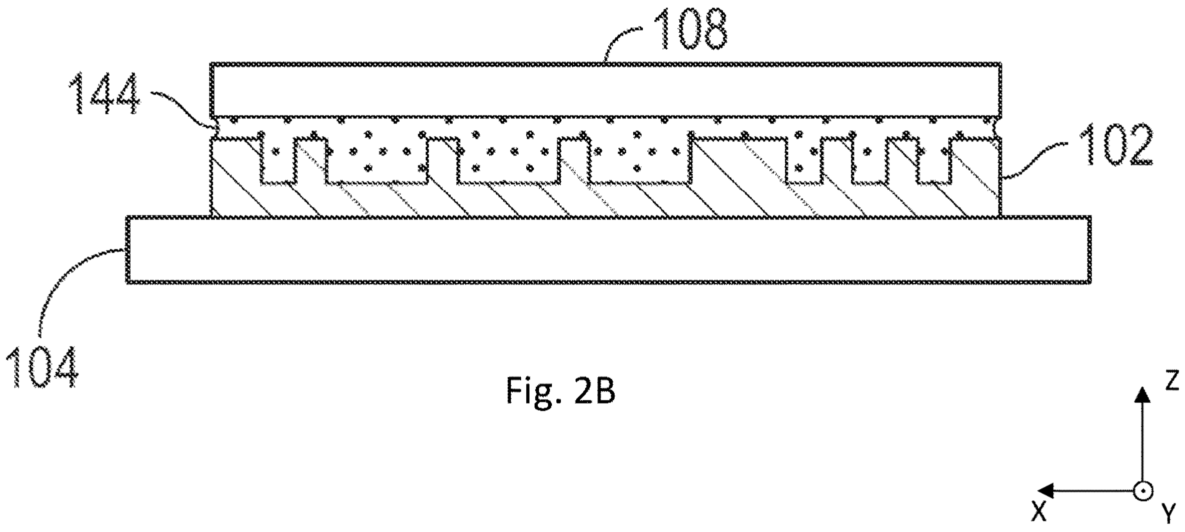
Figure 2C:
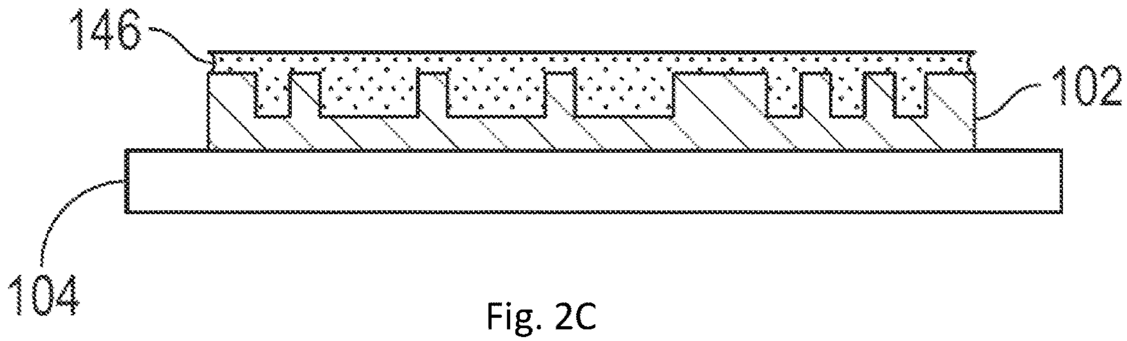

The planarization process includes steps which are shown schematically in FIGS. 2A-2C. As illustrated in FIG. 2A, the formable material 124 is dispensed in the form of droplets onto the substrate 102. As discussed previously, the substrate surface has some topography which may be known based on previous processing operations or may be measured using a profilometer, AFM, SEM, or an optical surface profiler based on optical interference effect like Zygo NewView 8200. The local volume density of the deposited formable material 124 is varied depending on the substrate topography. The superstrate 108 is then positioned in contact with the formable material 124. In the context of an imprint system, a template having a pattern is brought into contact with the deposited formable material 124.

FIG. 2B illustrates a post-contact step after the superstrate 108 has been brought into full contact with the formable material 124 but before a polymerization process starts. As the superstrate 108 contacts the formable material 124, the droplets merge to form a formable material film 144 that fills the space between the superstrate 108 and the substrate 102. Preferably, the filling process happens in a uniform manner without any air or gas bubbles being trapped between the superstrate 108 and the substrate 102 in order to minimize non-fill defects. The polymerization process or curing of the formable material 124 may be initiated with actinic radiation (e.g., UV radiation). For example, radiation source 126 of FIG. 1 can provide the actinic radiation causing formable material film 144 to cure, solidify, and/or cross-link, defining a cured planarized layer 146 on the substrate 102. Alternatively, curing of the formable material film 144 can also be initiated by using heat, pressure, chemical reaction, other types of radiation, or any combination of these. Once cured, planarized layer 146 is formed, the superstrate 108 can be separated therefrom. FIG. 2C illustrates the cured planarized layer 146 on the substrate 102 after separation of the superstrate 108. The substrate and the cured layer may then be subjected to additional known steps and processes for device (article) fabrication, including, for example, patterning, curing, oxidation, layer formation, deposition, doping, planarization, etching, formable material removal, dicing, bonding, and packaging, and the like. The substrate may be processed to produce a plurality of articles (devices).

Engagement Mechanism

As noted above, there is a need in the art for an improved planarization system having a device that is able to assist in positioning the substrate relative to the substrate chuck and is also able to assist in separating the superstrate from the cured layer. The planarization system 100 described herein includes an engagement mechanism 200 as such a device. The engagement mechanism 200 described herein serves a dual function of allowing for positioning of the substrate 102 relative to the substrate chuck 104 and also assisting in the separating of the superstrate 108 from the cured layer 146.

Figure 3A:
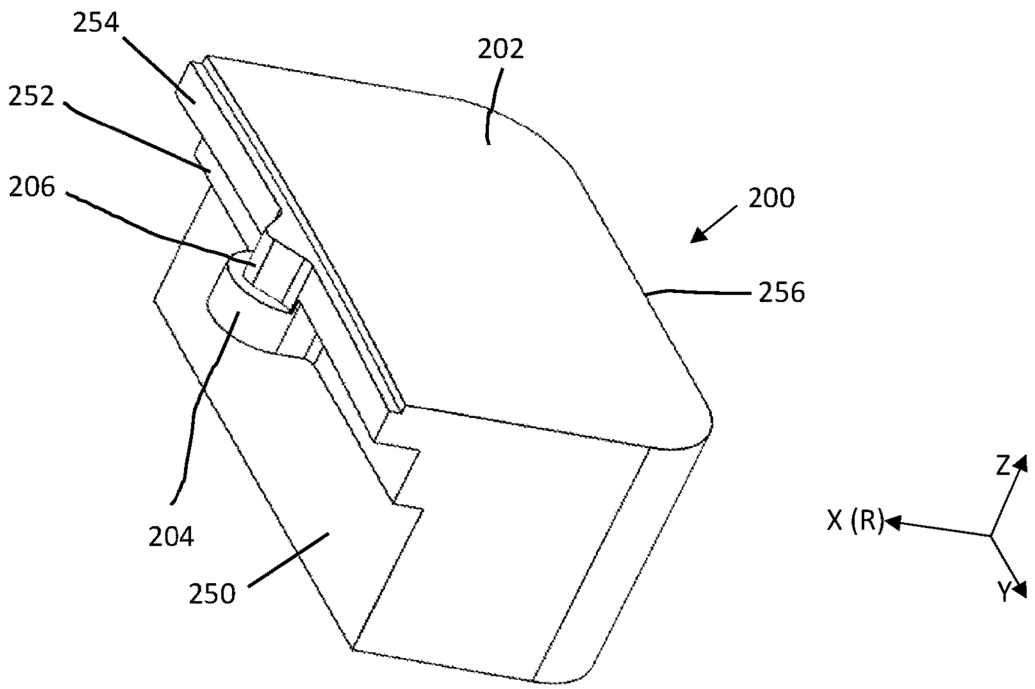
FIG. 3A shows a perspective view of an example engagement mechanism in accordance with an aspect of the present disclosure.
Figure 3B:
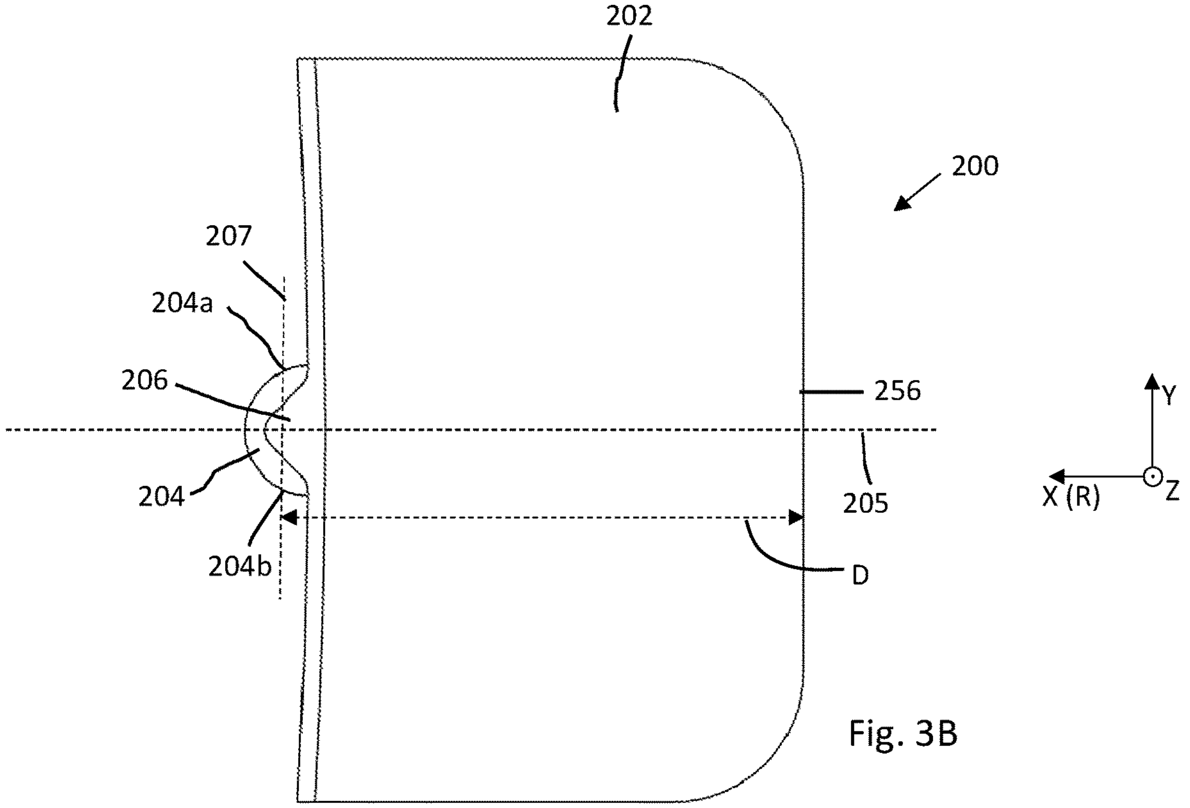
FIG. 3B shows a top view of the example engagement mechanism of FIG. 3A.
Figure 3C:
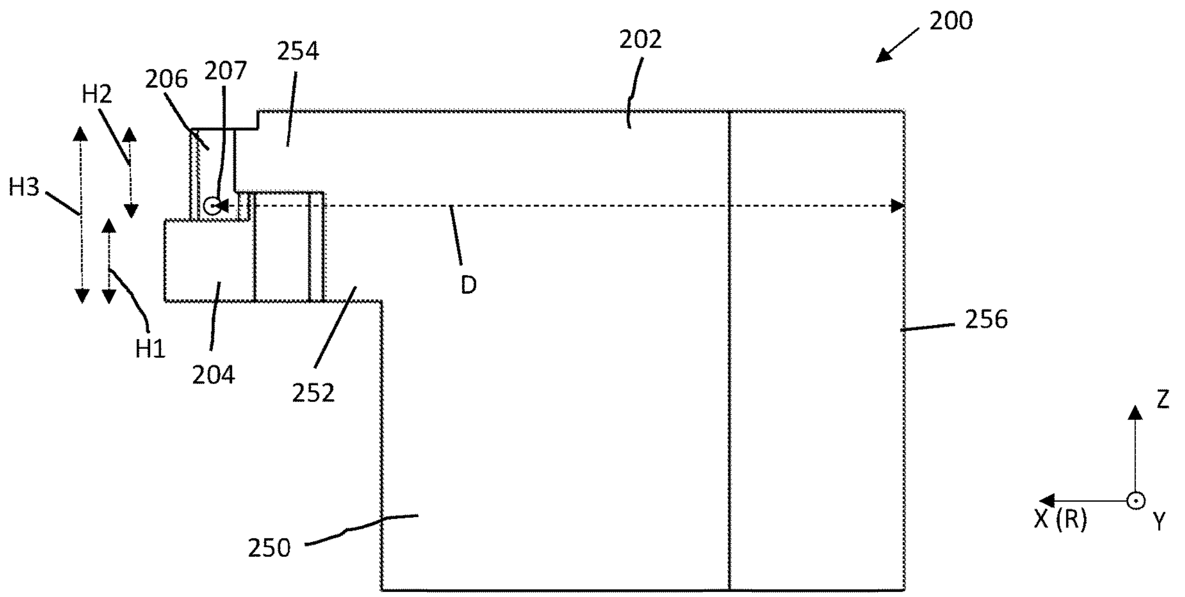
FIG. 3C shows a side view of the example engagement mechanism of FIG. 3A.
Figure 3D:
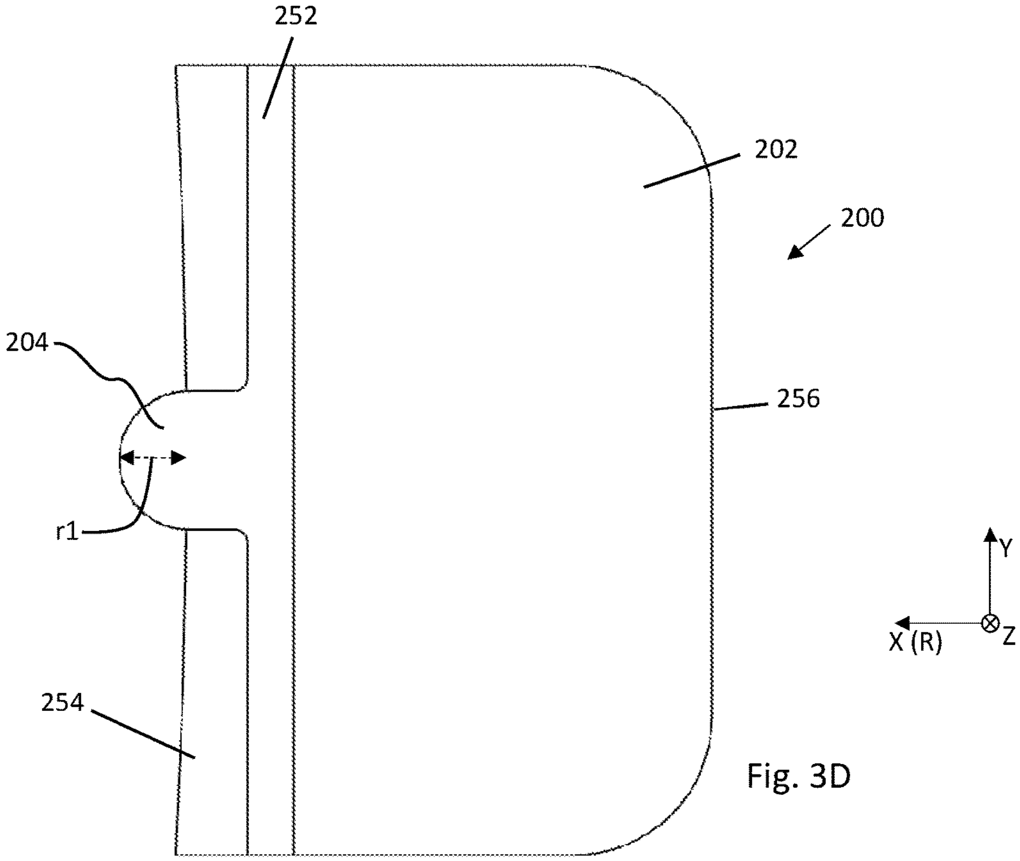
FIG. 3D shows a bottom view of the example engagement mechanism of FIG. 3A.

FIG. 3A shows a perspective view of the engagement mechanism 200 with all other structure of the planarization system omitted. FIG. 3B shows a top view of the engagement mechanism 200. FIG. 3C shows a side view of the engagement mechanism 200. FIG. 3D shows an underside view of the engagement mechanism 200.

The engagement mechanism 200 includes a body 202, a first protrusion 204, and second protrusion 206. As shown in FIGS. 3A-D, the first protrusion 204 has portions that extend farther out from the body 202 than the second protrusion 206. Furthermore, the first protrusion 204 and the second protrusion 206 may have different shapes as discussed below. The second protrusion 206 is positioned above the first protrusion 204 in the orientation shown in FIG. 3A to 3D. The position of the engagement mechanism 200 relative to other parts of the planarization system 100, and in particular relative to the substrate chuck 104, is described in more detail below with respect to FIGS. 4A to 4C. The engagement mechanism 200 is configured to raise from a retracted position to an elevated position as also explained below in more detail below. The engagement mechanism 200 having the first protrusion 204 and the second protrusion 206 allows the engagement mechanism 200 to serve two different functions during the planarization process. The first protrusion 204 is configured to engage with a notch in a substrate 102 to assist in mechanically positioning the substrate 102 relative to the substrate chuck 104. The second protrusion 206 is configured to engage with the underside surface of the superstrate 108 to assist in separating the superstrate from the cured layer 146 at a later moment in the planarization process. All of these aspects of the engagement mechanism 200 are described in more detail below.

As best seen in FIGS. 3A and 3C, the body 202 of the engagement mechanism 200 may have a stepped structure. More particularly, the body 202 may include a first portion 250, a second portion 252, and a third portion 254, where each portion extends further from the rear end 256 of the body 202. The first protrusion 204 extends from the second portion 252 and the second protrusion 206 extends from the third portion 254. As noted above, the first protrusion 204 has portions that extend farther than the second protrusion 206. FIG. 3B best shows the portions 204*a*, 204*b* of the first protrusion 204 that extend farther than the second portion 206. More particularly, as shown in FIG. 3B, the portions 204*a*, 204*b* extend farther in the Y direction than corresponding portions of the second protrusion 206. The Y direction in which the portions 204*a*, 204*b* extend further is in a direction perpendicular to a first line 205 extending in the radial direction R through both the first protrusion 204 and the second protrusion 206. That is as shown in FIG. 3B, the first line 205 is a centerline 205 passes through the center of the first protrusion 204 and the second protrusion 206. A second line 207 extends perpendicular to the first line 205. The second line 207 intersects with the first protrusion 204 at two points and the intersects with the second protrusion 206 at corresponding two points. The portions 204*a*, 204*b* of the first protrusion that intersect with the second line 207 are farther from the first line 205 than the portions of the second protrusion that also intersect with the second line 207.

A distance D from the rear end 256 to the point where the first line 205 intersects with the second line may be 5 to 75 mm. As also shown in FIG. 3C, H1 is the height of the first protrusion 204, H2 is the height of the second protrusion H2, and H3 is the height of both protrusions together. H1 may be 1.40 mm±10% in an example embodiment. H1 may be at least the thickness of the substrate, for example at least 0.775 mm. H2 may be 1.60 mm±10% in an example embodiment. H2 may be equal to the thickness of the substrate plus the amount of Z distance needed to initiate the separation front, discussed below. H3 may be 3.00 mm±10% in an example embodiment.

As best seen in FIGS. 3A, 3B, and 3D, the first protrusion 204 may have a shape that is half of a stadium shape (also known as pill or obround). The radius r1 of the curved portion of the stadium shape may be selected so that the first protrusion is capable of tangentially contacting the notch in the substrate (the substrate being, for example, a semiconductor wafer). Substrates (semiconductor wafers) are known in the art to include notches defined by a SEMI standard. The radius r1 may be 1.5 mm. The second protrusion 206 may have a triangular shape with a radiused tip. The second protrusion shape may have generally have any shape that is capable of passing through the notch, as discussed below. A cross-section of the first protrusion 204 has a larger area than a cross-section of the second protrusion 206. A ratio of the cross-sectional area of the first protrusion 204 to the cross-sectional area of the second protrusion 206 may be between 1.1:1 to 2.5:1.

Figure 4A:
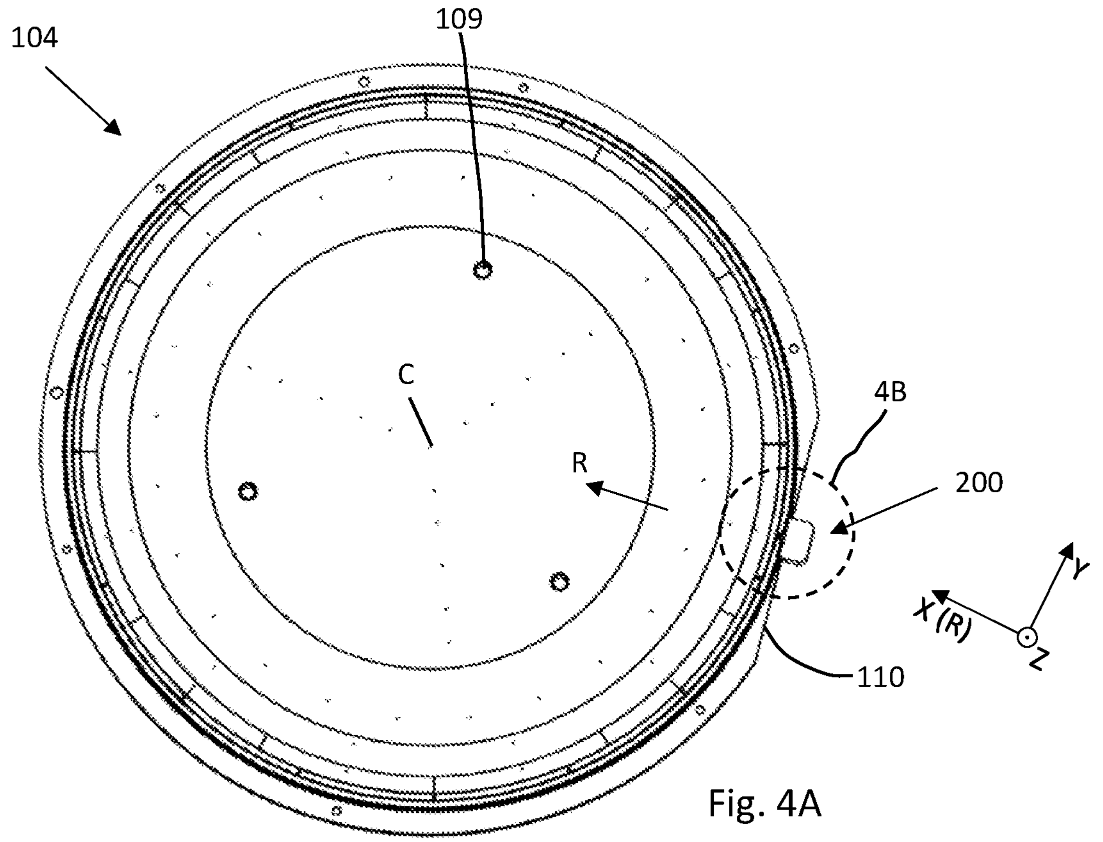
FIG. 4A shows a top view of an example substrate chuck and the engagement mechanism in accordance with an aspect of the present disclosure.
Figure 4B:
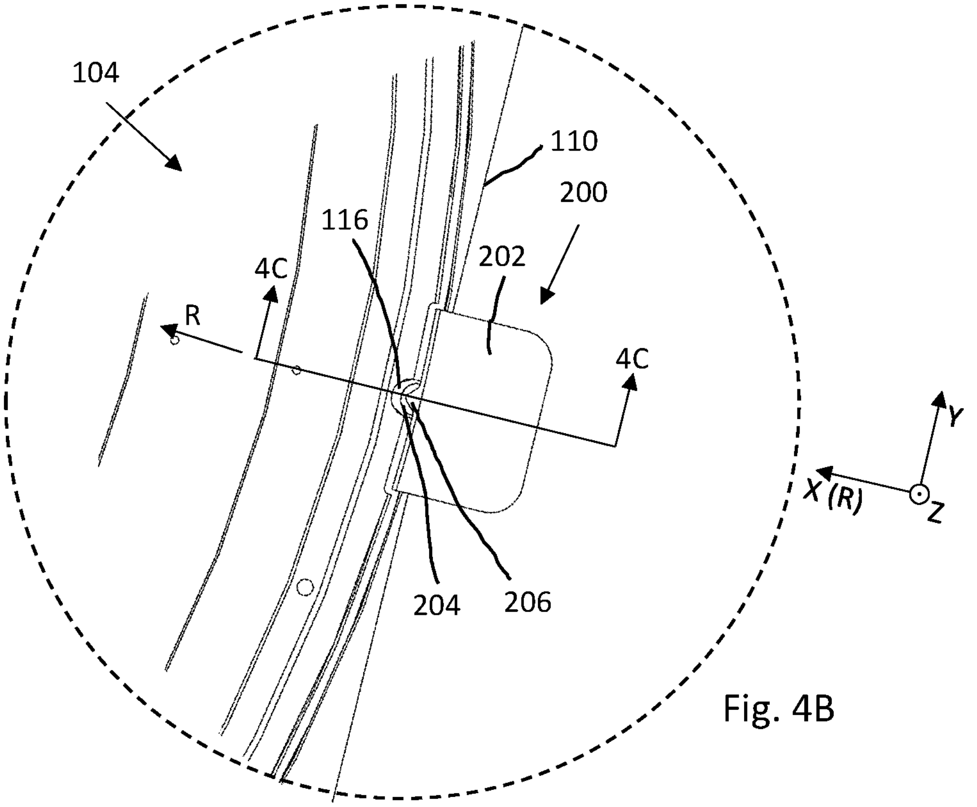
FIG. 4B shows a close up of portion 4B of FIG. 4A.
Figure 4C:
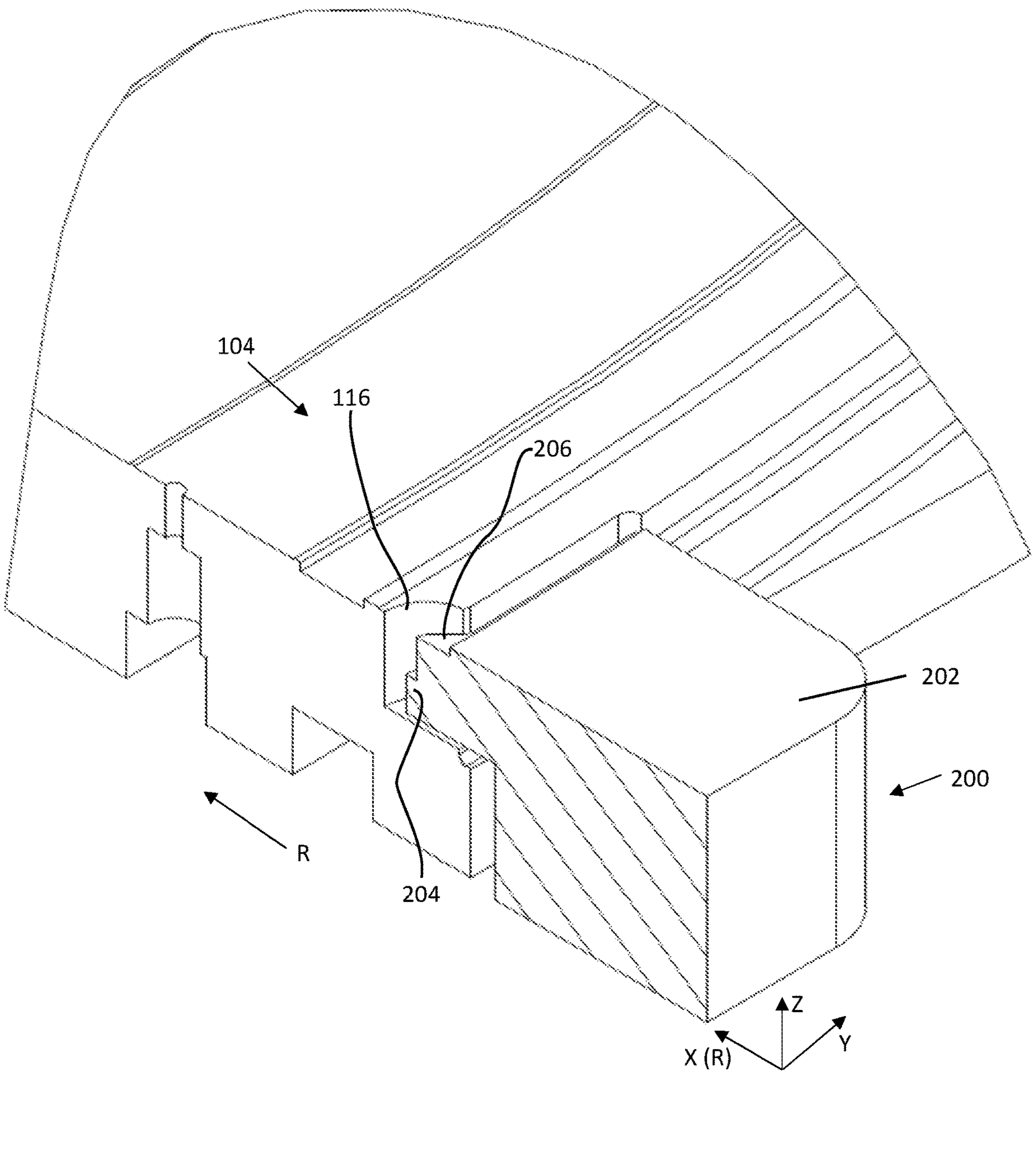
FIG. 4C shows a cross-section view taken along line 4C of FIG. 4A.

FIG. 4A shows a top-down view of the substrate chuck 104 and the engagement mechanism 200 adjacent the substrate chuck 104 when the engagement mechanism 200 is in the retracted position. FIG. 4B shows a close-up portion 4B of FIG. 4A. FIG. 4C shows a perspective cross-section view taken along line 4C-4C of FIG. 4B.

As best seen in FIG. 4A, the substrate chuck 104 may include a cutout 110 to accommodate the engagement mechanism 200 being adjacent the substrate chuck 104. As shown in FIG. 4A the substrate chuck 104 is generally circular in shape other than cutout 110. The substrate chuck

104 may further include a notch 116 to coincide with first protrusion and second protrusions of the engagement mechanism 200. The chuck 104 may include a plurality of pin holes 109 through which the mounting pins 114 may pass through when extended. In an embodiment, the chuck 104 may include at least three holes and three mounting pins 114.

The first protrusion 204 extends from the second portion 252 of the body 202 in a radial direction R toward the center C of the substrate chuck 104. Similarly, the second protrusion 206 extends from the third portion 254 of the body 202 in the radial direction R toward the center C of the substrate chuck 104. However, as noted above, as best seen in FIG. 4C, the first protrusion 204 extends farther in the radial direction R toward the center C than the second protrusion 206. In other words, the maximum point in the radial direction of the first protrusion 204 is closer to the center C than the maximum point in the radial direct R of the second protrusion 206. As also best shown in FIG. 4C, when the engagement mechanism 200 is in the retracted portion, each of the first protrusion 204 and the second protrusion 206 are located within the notch 116 of the substrate chuck.

Each of FIGS. 4A to 4C show a moment prior to chucking/coupling the substrate 102 to the substrate chuck 104. As discussed above, as part of the planarizing method, prior to reaching the planarizing station 105, formable material 124 may be dispensed on the substrate 102 at the dispensing station 103. During this period, the engagement mechanism 200 is in the retracted position shown in FIGS. 4A to 4C. After the formable material 124 has been dispensed onto the substrate 102, the positioning system, including the articulating arms and the hand 130, may be used to pick up the substrate 102 and bring it to the planarizing station 105. In an alternative embodiment, the formable material 124 is dispensed onto the substrate 102 after it has been loaded onto the substrate chuck 104 on the planarization station 105.

Figure 5:
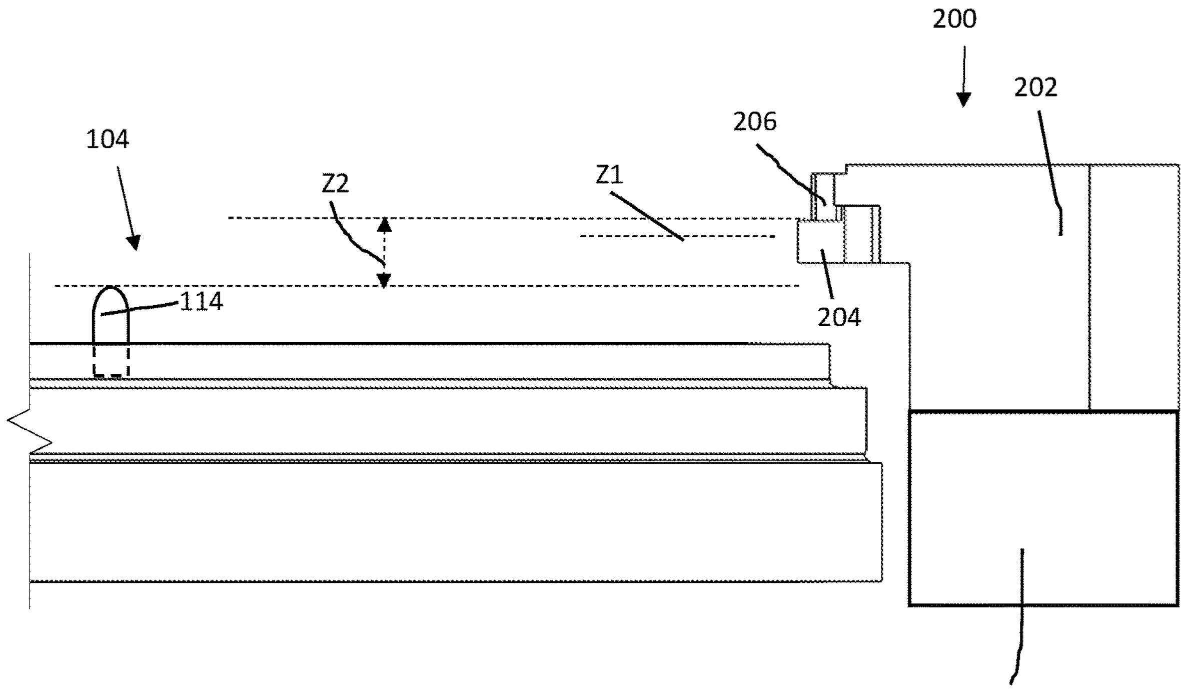
FIG. 5 shows a partial side view of the substrate chuck and the engagement mechanism when the engagement mechanism is an elevated position, in accordance with an aspect of the present disclosure.

As the articulating arms and the hand 130 bring the substrate 102 (having the formable material 124 dispensed thereon) to the substrate chuck 104 at the planarizing station 105, the first function of the engagement mechanism 200 may be implemented. As noted above, one function of the engagement mechanism 200 is to assist in mechanically positioning the substrate 102 relative to the substrate chuck 104. This function is achieved by utilizing the first protrusion 204 of the engagement mechanism 200. In order to utilize the first protrusion 204, the engagement mechanism is first lifted from the retracted position shown in FIGS. 4A to 4C to an elevated position. FIG. 5 shows a partial side view of engagement mechanism 200 in the elevated position relative to the substrate chuck 104. As shown in FIG. 5, the system 100 may include a lifting mechanism 210, which can be controlled by the controller to lift the engagement mechanism from the retracted position to the elevated position. The lifting mechanism 210 may be a device that can linearly translate the engagement mechanism 200 in the Z direction. For example, the lifting mechanism 210 may be an actuator for example a linear actuator comprised of linear bearings, voice coil motors, and linear encoder, or any actuator that is capable of moving the engagement mechanism 200 in the z direction. At the same time, the mounting pin 114 is extended in preparation for eventually receiving the substrate 102. The mounting pin 114 is shown in FIG. 5 schematically both in terms of location and size. That is, in a preferable embodiment, the mounting pin 114 is not located as close to the outer edge of the substrate chuck 104 as illustrated. Rather, as noted above, the mounting pin 114 passes through the pin holes 109, which are preferably located in the position shown in FIG. 4A. However, in order to illustrate the relative Z position of the mounting pin 114 at the same time as illustrating the engagement mechanism 200, the mounting pin is shown closer to the edge of the substrate chuck than in FIG. 4A. The same principle is true in all of the FIGS. 5, 6, 10, 14A to 25.

With the lifting mechanism 210 in the elevated position shown in FIG. 5, the hand 130 holding the substrate 102 may then position the substrate 102 over the substrate chuck 104 while moving the substrate 102 toward the engagement mechanism 200. The amount of lift in the Z direction and the Z dimension position of the substrate 102 as the hand 130 carries the substrate 102 is particularly controlled so that the Z position Z1 of the first protrusion 204 is at the same Z position Z1 of the substrate 102. Notably, the Z position Z1 is controlled so that the substrate 102 is specifically aligned with the first protrusion 204 and not the second protrusion 206 or any other portion of the engagement mechanism 200. Furthermore, the amount of clearance Z2 between the mounting pins 114 and the top of the first protrusion 204 may be selected so that neither the hand 130 nor the substrate 102 will accidentally come into contact with the mounting pins 114 or the substrate chuck 104. For example, the clearance Z2 may be at least 1 mm.

Figure 6:
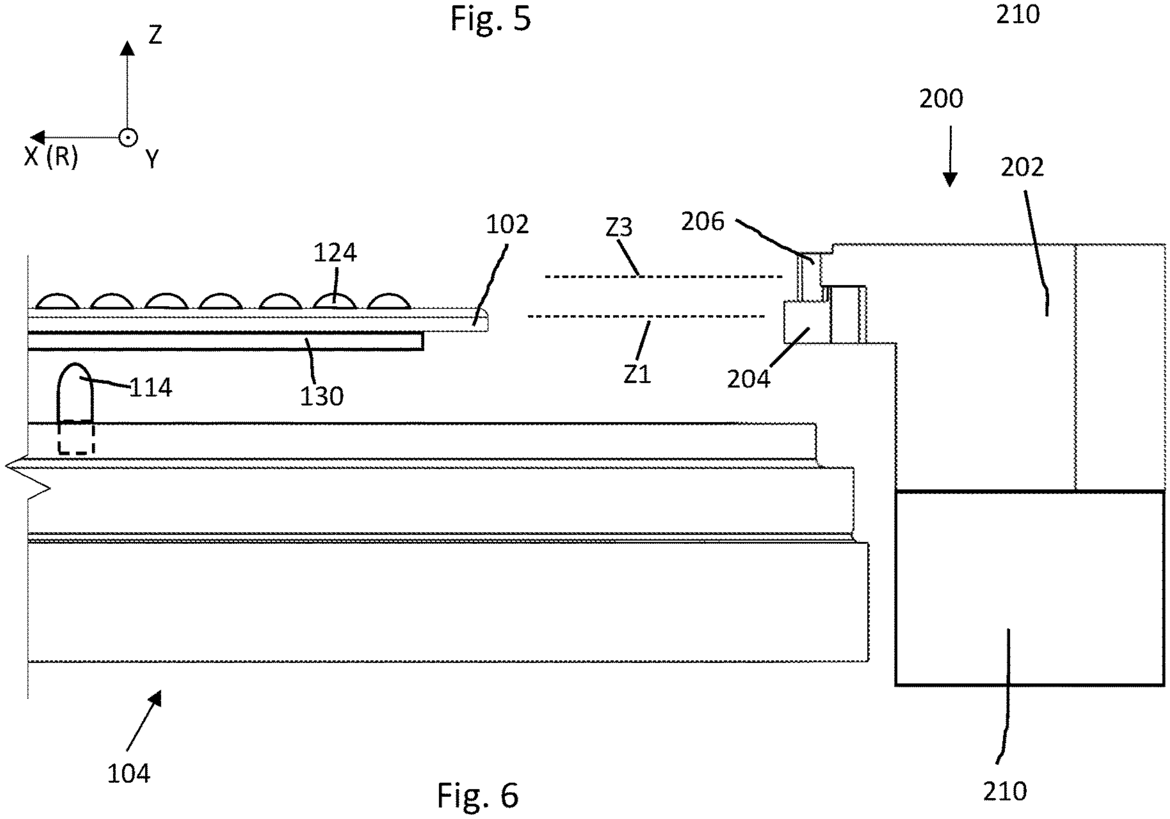
FIG. 6 shows a partial side view of the substrate chuck and the engagement mechanism when the engagement mechanism is an elevated position and when a substrate is approaching the engagement mechanism, in accordance with an aspect of the present disclosure.

FIG. 6 shows a partial side view of the engagement mechanism 200 in the elevated position relative to the substrate chuck 104, as the hand 130 begins to bring in the substrate 102 over the substrate chuck 104. As shown in FIG. 6, the substrate 102 is being carried by the hand 130 such that the Z position of the substrate 102 is aligned with the Z position of the first protrusion 204. In particular, a midpoint between the top of the substrate and the bottom of the substrate 102 in the Z direction about the same Z position as the midpoint between the top of the first protrusion 204 and the bottom of the first protrusion 204.

Figure 7A:
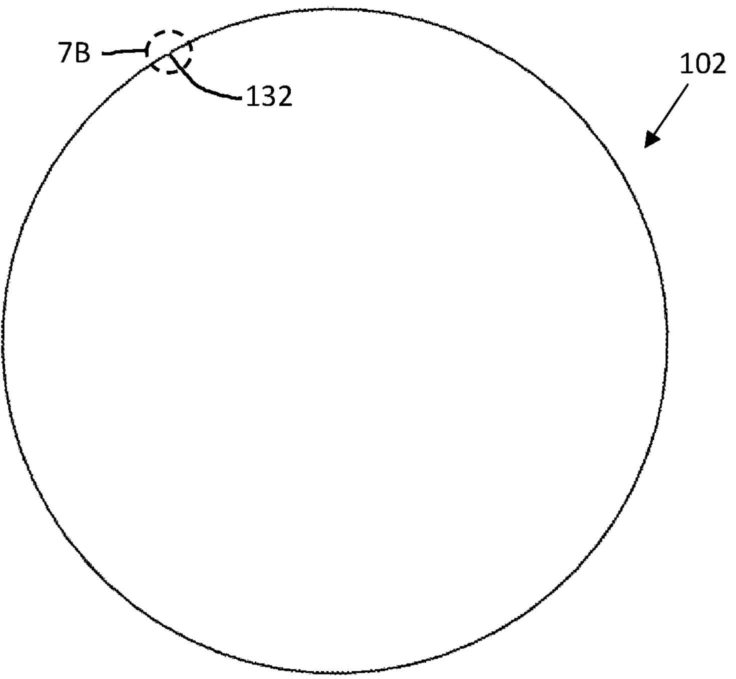
FIG. 7A shows a top view of a substrate having a notch in accordance with an aspect of the present disclosure.
Figure 7B:
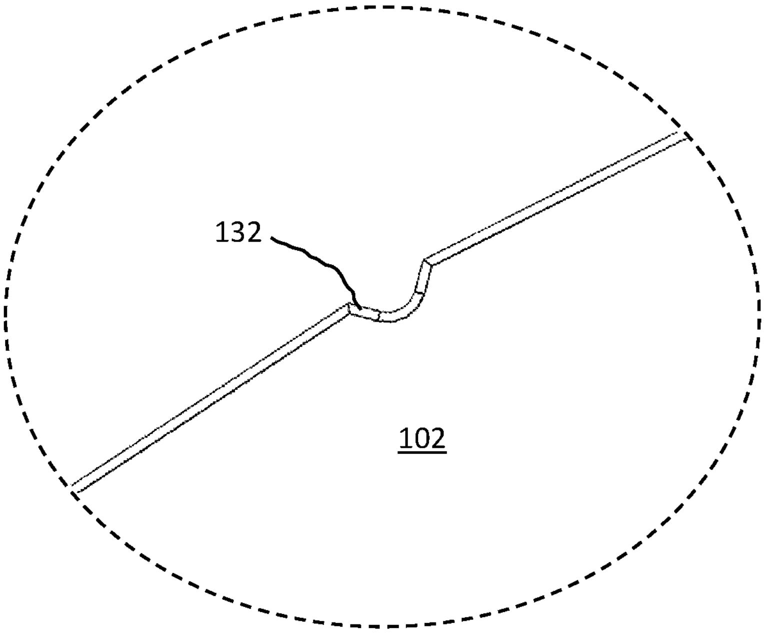
FIG. 7B shows a close up view of portion 7B of FIG. 7A.

The ability of the first protrusion 204 to assist in mechanically aligning the substrate 102 with the substrate chuck 104 is achieved by engaging with a notch 132 that is formed at the periphery of the substrate 102. FIG. 7A shows a top view of the substrate 102 with the notch 132. FIG. 7B shows a close up view of the portion 7B of FIG. 7A. As shown in FIG. 7B the notch 132 is a cutout at the periphery of the substrate 102 that is defined by the edges of the substrate 102. The notch 132 of the substrate 102 in the illustrated example embodiment has a curved shape in accordance with SEMI standards on notches in semiconductor wafers. The notch 132 of the substrate 102 may have a blend radius of at least 0.9 mm in one example embodiment. The radial position of the notch 132 is already known by the controller. The substrate 102 is picked up and carried by the hand 130 such that when the hand 130 carrying the substrate 102 approaches the first protrusion 204, the notch 132 is ideally radially aligned with the first protrusion 204. As described below, the contact between the first protrusion 204 and the inner surface of the notch 132 assists in properly positioning the substrate 102 relative to the substrate chuck 104.

As the hand 130 carrying the substrate 102 moves toward the engagement mechanism 200 at the predetermined Z position, the substrate 102, and more particularly, the notch 132 of the substrate 102, approaches the first protrusion 204 of the engagement mechanism 200. As noted above, the Z position Z1 is controlled so that substrate 120, and more particular the notch 132, is has the same Z position Z1 as the first protrusion 204 and not the Z position Z3 of second protrusion 206 or any other portion of the engagement mechanism. There are three potential cases when the notch 132 reaches the engagement mechanism 200. In a first case, the notch 132 is already perfectly radially aligned with the first protrusion 102 such that the first protrusion 204 enters into the notch without any rotational adjustment of the substrate 102, i.e., the center of the curve of the first protrusion 204 is precisely radially aligned with the center of the notch 132. In a second case, the notch 132 is slightly radially offset from the first protrusion 204, i.e., the center of the curve of the first protrusion 102 is not radially aligned with the center of the notch 132, but is still radially aligned within the boundaries of the notch 132. In this second case a rotational adjustment of the substrate 102 is mechanically performed to perfect the alignment, which is discussed below. In a third case, the notch 132 is more significantly radially offset from the first protrusion, i.e., the center of the curve for the first protrusion 102 is not radially aligned with the center of the notch 132, and is also outside the boundary of the notch 132. In this third case, the mechanical adjustment of the second case is not performed, which is discussed below.

Figure 8A:
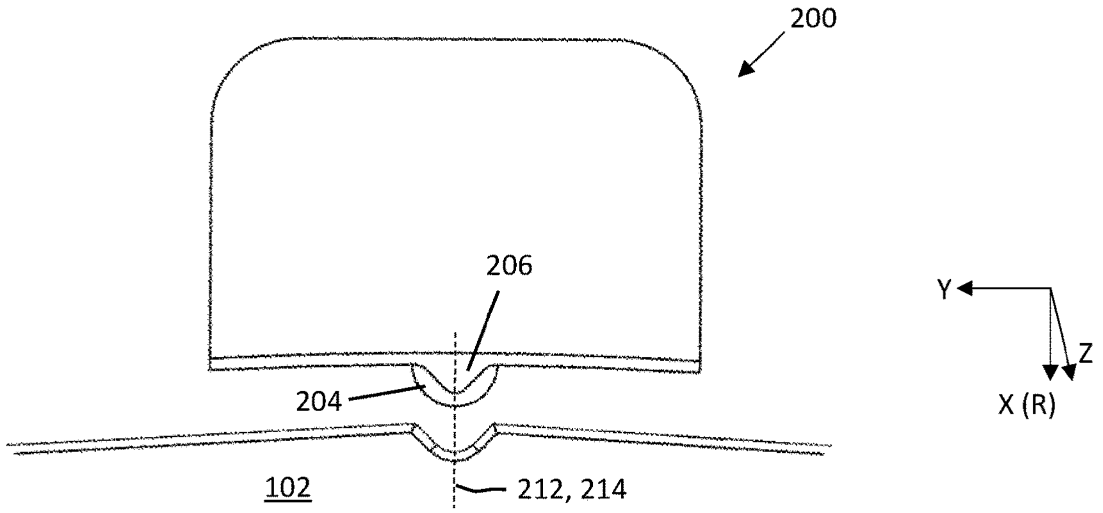
FIGS. 8A and 8B show partial top views of the substrate and the engagement mechanism as the engagement mechanism approaches and engages with a notch of a substrate, in accordance with another aspect of the present disclosure.
Figure 8B:
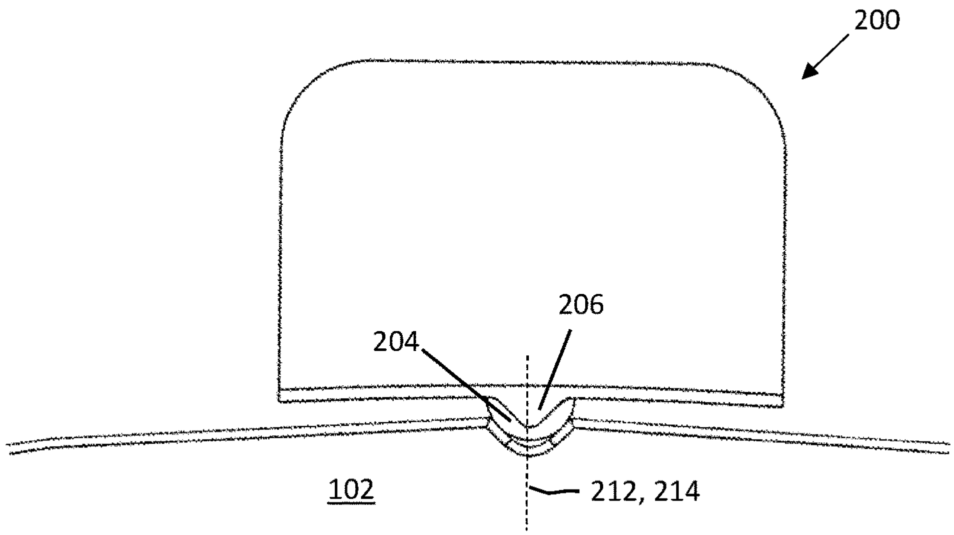

FIGS. 8A and 8B show top views of the substrate 102 and the engagement mechanism 200 as the substrate 102 approaches the engagement mechanism in the first case. All other portions for the system are omitted for clarity. While not shown, at this moment the substrate 102 is being carried by the hand 130 and the substrate 102 has formable material 124 dispensed thereon. As shown in FIG. 8A, as the substrate 102 approaches the engagement mechanism 200, the center of the curve of the first protrusion 204 is radially aligned with the center of the notch 132 of the substrate 102 such that a centerline 212 passing through the center of the curve of the first protrusion 204 is the same as a centerline 214 passing through the center of the curve of the notch 132. Thus, FIGS. 8A and 8B illustrate the first case where the substrate 102 and the engagement mechanism 200 are already radially aligned. FIG. 8B shows the moment after the notch 132 of the substrate 102 is completely engaged with the first protrusion 204 of the engagement mechanism 200. This moment occurs when the hand 130 carrying the substrate 102 has continued to progress toward the engagement mechanism 200 as compared to the moment in FIG. 8A. That is, the hand 130 continues to move the substrate 102 in the X direction while maintaining the Z position until the first protrusion 204 is inside the notch 132. As shown in FIGS. 8A and 8B, there is no rotational adjustment of the substrate 102 between the moment before engagement and the moment after engagement of the notch 132 with the first protrusion 204 because the substrate 102 was already radially aligned with the first protrusion 204.

Figure 9A:
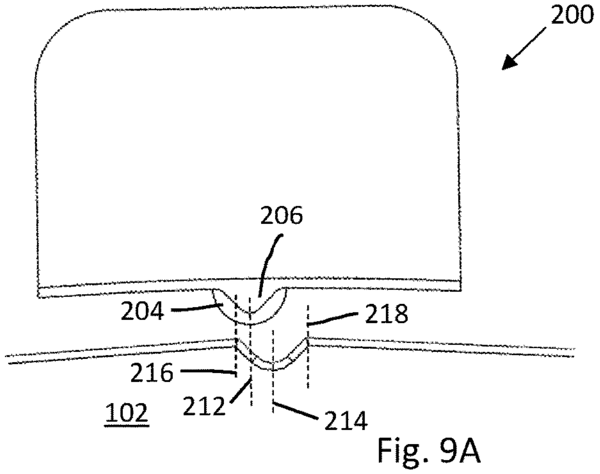
FIGS. 9A to 9D show partial top views of the substrate and the engagement mechanism as the engagement mechanism approaches and engages with a notch of a substrate, in accordance with another aspect of the present disclosure.

FIGS. 9A to 9D show top views of the substrate 102 and the engagement mechanism 200 as the substrate 102 approaches the engagement mechanism in the second case. All other portions for the system are omitted for clarity. While not shown, at this moment the substrate 102 is being carried by the hand 130 and the substrate 102 has formable material 124 dispensed thereon. As shown in FIG. 9A, as the substrate 102 first approaches the engagement mechanism 200, the center of the curve of the first protrusion 204 is not radially aligned with the center of the notch 132 of the substrate 102, such that the centerline 212 passing through the center of the curve of the first protrusion 204 does not overlap the centerline 214 passing through the center of the curve of the notch 132. Notably, however, the centerline 212 of the first protrusion 204 is radially aligned within the boundary of the notch 132. More particularly, the centerline 212 of the first protrusion 204 is between the edges 216, 218 that define the endpoints of the notch 132. Thus, FIGS. 9A to 9D illustrate the second case where the substrate 102 and the engagement mechanism 200 are not radially aligned, but the misalignment is not so great that the first protrusion 204 is not completely outside bounds of the notch 132.

Figure 9B:
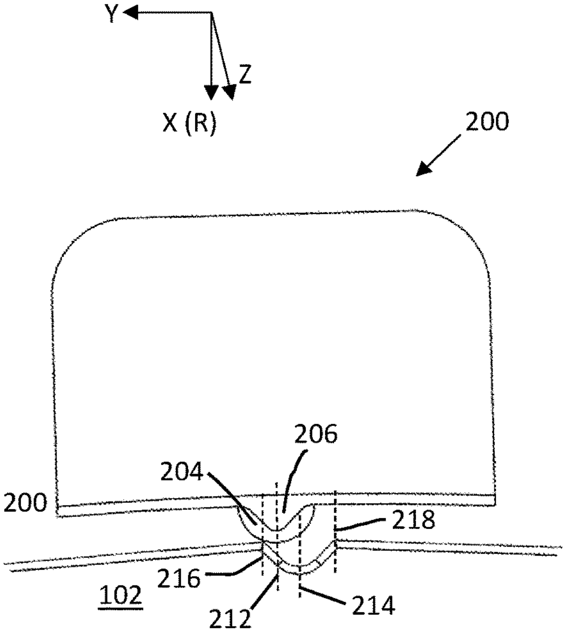

FIG. 9B shows the moment that the first protrusion 204 of the engagement mechanism 200 comes into contact with the substrate 102. This moment occurs when the hand 130 carrying the substrate 102 has continued to progress toward the engagement mechanism 200 as compared to the moment in FIG. 9A. That is, the hand 130 continues to move the substrate 102 in the X direction while maintaining the Z position until the first protrusion 204 comes into contact with notch 132, though off-center. As shown in FIG. 9B, the same misalignment of FIG. 9A is present at the moment of first contact. That is, the centerline 212 of the first protrusion 204 has the same amount of misalignment with the centerline 214 of the notch 132 at the moment of first contact.

Figure 9C:
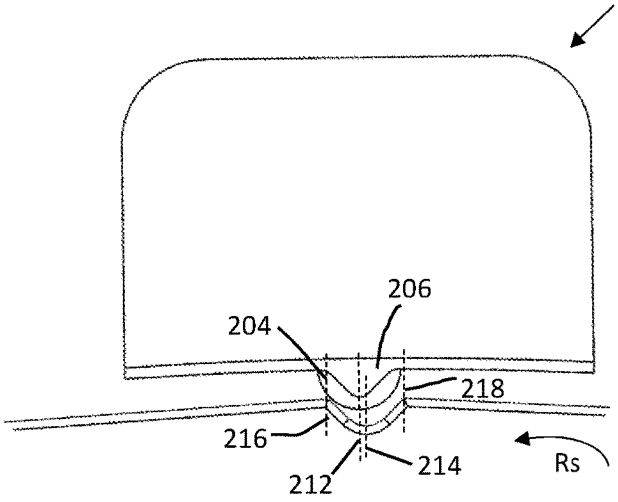

FIG. 9C shows a moment after continued moving of the substrate 102 toward first protrusion 204. This moment occurs when the hand 130 carrying the substrate 102 has continued to progress toward the engagement mechanism 200 as compared to the moment in FIG. 9B. That is, the hand 130 continues to move the substrate 102 in the X direction while maintaining the Z position even after the substrate 102 has come into contact with the first protrusion 204. Because the first protrusion 204, while being misaligned/off-center relative to the center of notch 132, is still within the boundary of the notch 132, the complimentary shapes of the notch 132 and the first protrusion 204, along with the force imparted by the hand 130, causes the substrate 102 to rotate in the rotation direction Rs and slide (translate) in for example the X/radial direction R so that that the centerline 214 of the notch 132 approaches the centerline 212 of the first protrusion 204. In other words, as the sides of the notch 132 are pushed against the first protrusion 204, the substrate 102 will rotate to better accommodate the first protrusion 204 as more of the first protrusion 204 enters the notch 132. Thus, as shown in FIG. 9C, the amount of misalignment between the notch 132 and the first protrusion 204 has been reduced as compared to the moments shown in FIGS. 9A and 9B. That is, the centerline 212 of the first protrusion 204 is closer to the centerline 214 of the notch 132 at the moment shown in FIG. 9C as compared to the moments shown in FIGS. 9A and 9B.

Figure 9D:
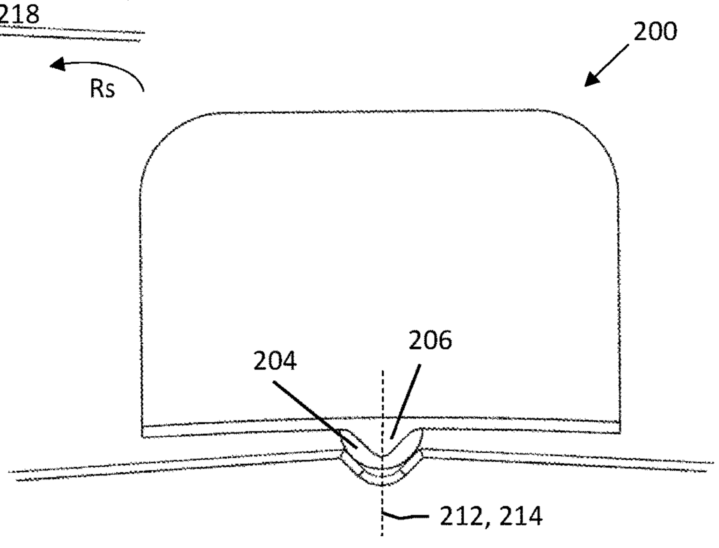

FIG. 9D shows the moment after the notch 132 of the substrate 102 is completely engaged with the first protrusion 204 of the engagement mechanism 200. This moment occurs when the hand 130 carrying the substrate 102 has continued to progress toward the engagement mechanism 200 as compared to the moment in FIG. 9C. That is, the hand 130 continues to move the substrate 102 in the X direction while maintaining the Z position. As with the moment shown in FIG. 9C, the complimentary shapes of notch 132 and the first protrusion 204, along with the force imparted by the hand 130, causes the substrate 102 to further rotate\slide until the centerline 214 of the notch 132 coincides with the centerline 212 of the first protrusion 204. In other words, as the sides of the notch 132 are continued to be pushed against the first protrusion 204, the substrate 102 will continue rotate\slide to fully accommodate the first protrusion 204 as the first protrusion 204 fully enters the notch 132. Thus, as shown in FIG. 9D, the amount of misalignment between the notch 132 and the first protrusion 204 has been eliminated as compared to the moment shown in FIG. 9A. That is, the centerline 212 of the first protrusion 204 is the same position as the centerline 214 of the notch 132 at the moment shown in FIG. 9D as compared to the moment shown in FIG. 9C. Notably, the end result shown in FIG. 9D is the same as the end result shown in FIG. 8B. Thus, the first protrusion 204 assists in aligning the substrate 102 via engagement with the notch 132 even with the initial approach of the substrate 102 is not initially aligned. Once the substrate 102 has fully engaged with the first protrusion 102 via the notch 132, the operator knows that the substrate 102 has been appropriately positioned relative to the substrate chuck 104.

Figure 10:
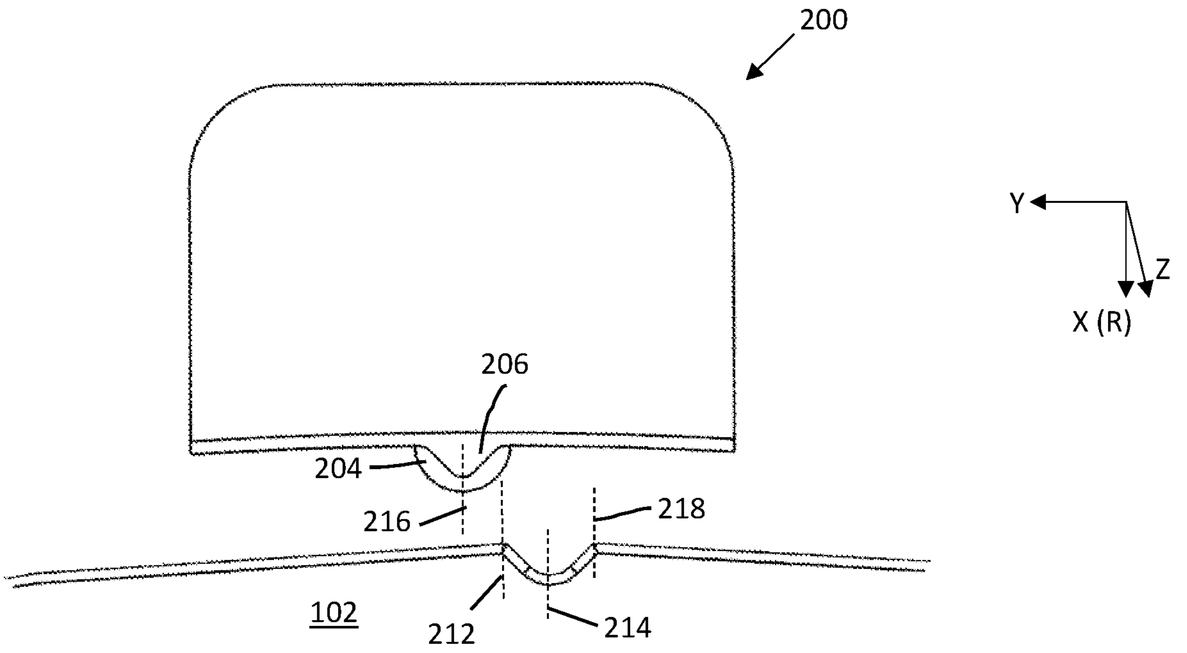
FIG. 10 shows a partial top view of the substrate and the engagement mechanism where the engagement mechanism fails to engage with the notch of the substrate.

FIG. 10 shows a top view of the substrate 102 and the engagement mechanism 200 as the substrate 102 approaches the engagement mechanism in the third case. All other portions for the system are omitted for clarity. While not shown, at this moment the substrate 102 is being carried by the hand 130 and the substrate 102 has formable material 124 dispensed thereon. As shown in FIG. 10, as the substrate 102 first approaches the engagement mechanism 200, the center of the curve of the first protrusion 204 is not radially aligned with the center of the notch 132 of the substrate 102, such that the centerline 212 passing through the center of the curve of the first protrusion 204 does not overlap the centerline 214 passing through the center of the curve of the notch 132. Notably, the centerline 212 of the first protrusion 204 is located outside the boundaries of the notch 132. More particularly, the centerline 212 of the first protrusion 204 is outside the edges 216, 218 that define the endpoints of the notch 132. Thus, FIG. 10 illustrate the third case where the misalignment is large enough that the first protrusion 204 is outside bounds of the notch 132. In this third case, when the substrate 102 comes into contact with the first protrusion 204, the mechanical adjustment descried above with respect to the second case in FIGS. 9A to 9D cannot take place. This is because the first protrusion 204 does not come into contact with any portion of the notch 132. Without the complimentary shapes of the first protrusion 204 and the notch 132 contacting each other, additional force of the substrate 102 against the first protrusion 204 will not cause the substrate 102 to rotate. Thus, in the third case, the in order to continue operation, the operator may abandon the current approach and make a new attempt with this or another substrate. In an embodiment, in the third case, a delay between dispensing and planarization may be too long and the planarization will need to be abandoned.

Figure 11A:
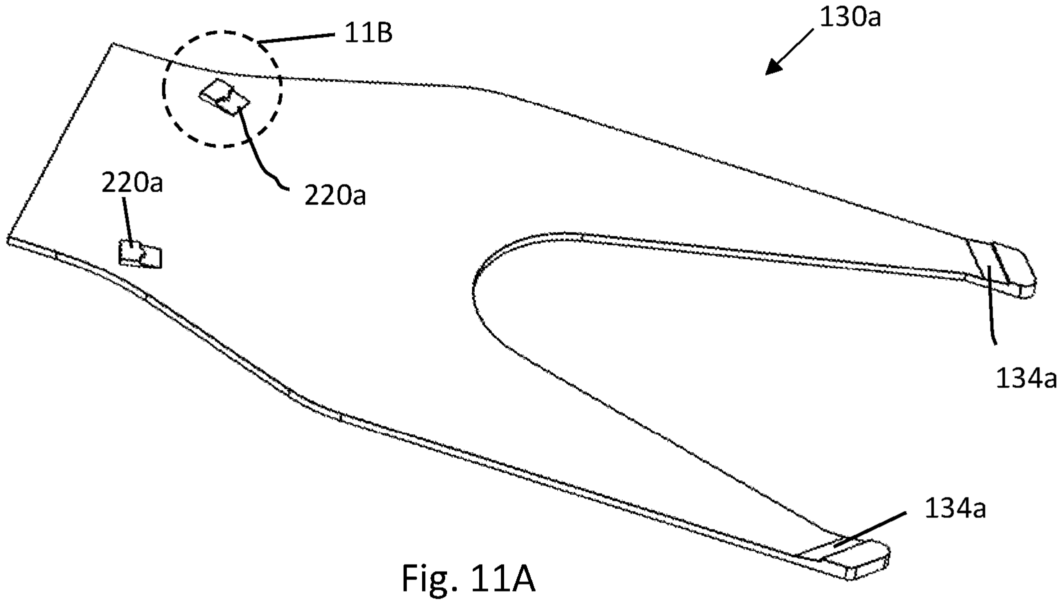
FIG. 11A shows a perspective view of a hand in accordance with an aspect of the present disclosure.
Figure 11B:
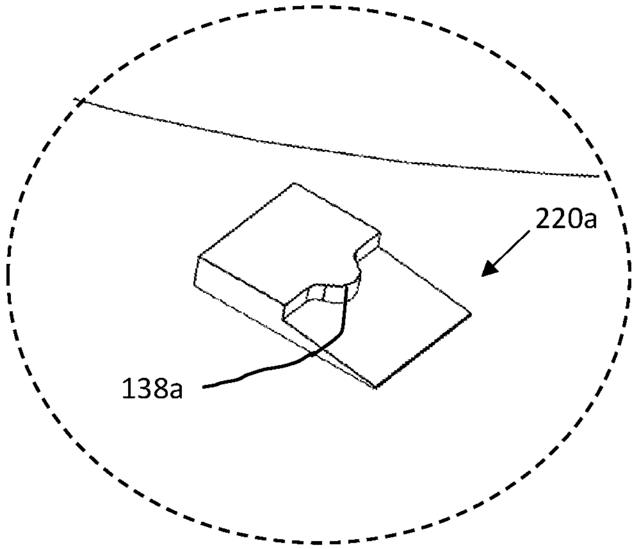
FIG. 11B shows a close up of portion 11B of FIG. 11A.
Figure 12A:
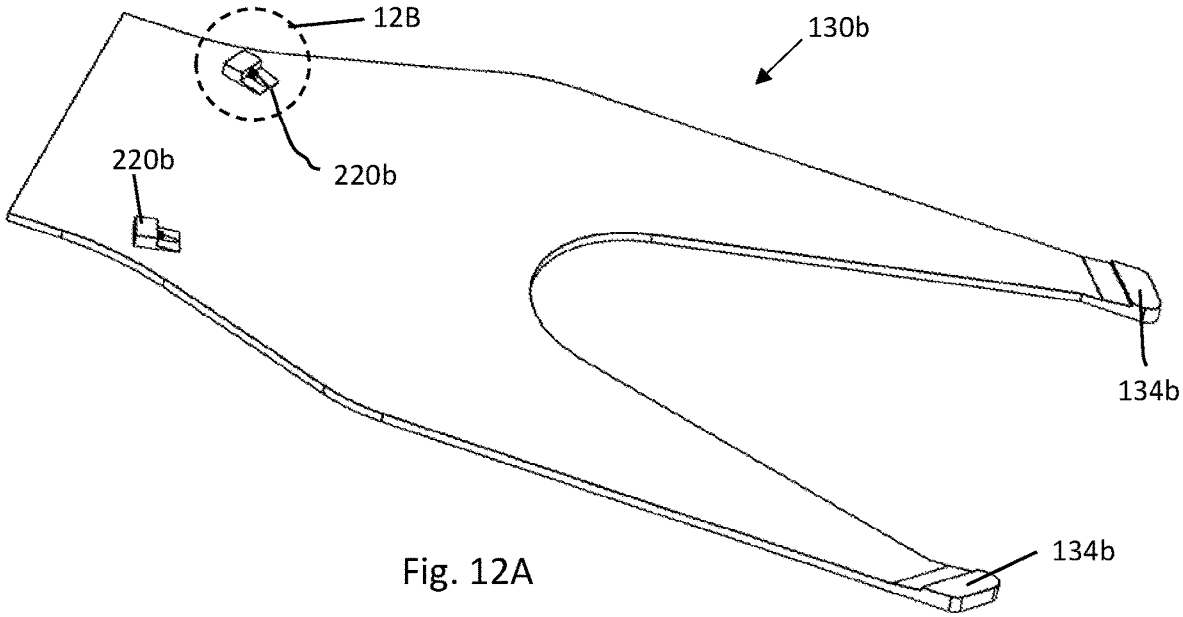
FIG. 12A shows a perspective view of a hand in accordance with another aspect of the present disclosure.
Figure 12B:
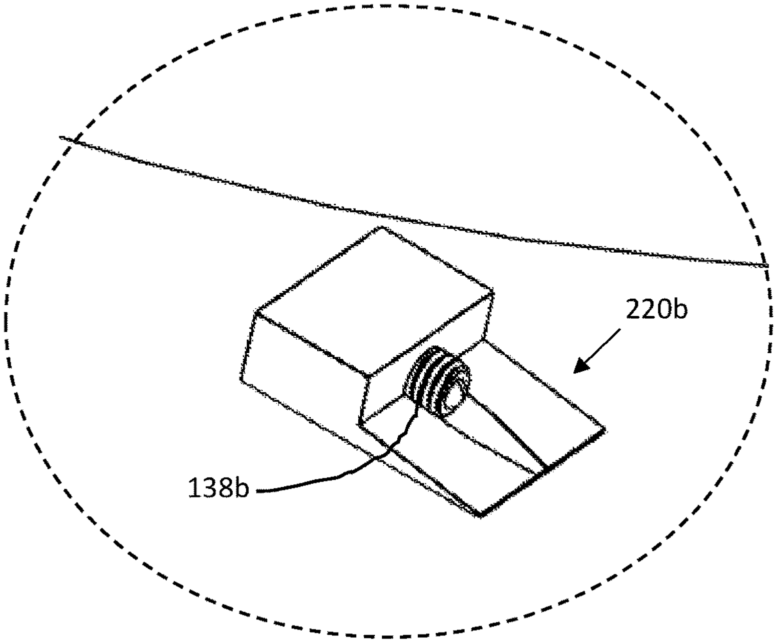
FIG. 12B shows a close up of portion 12B of FIG. 12A.
Figure 13A:
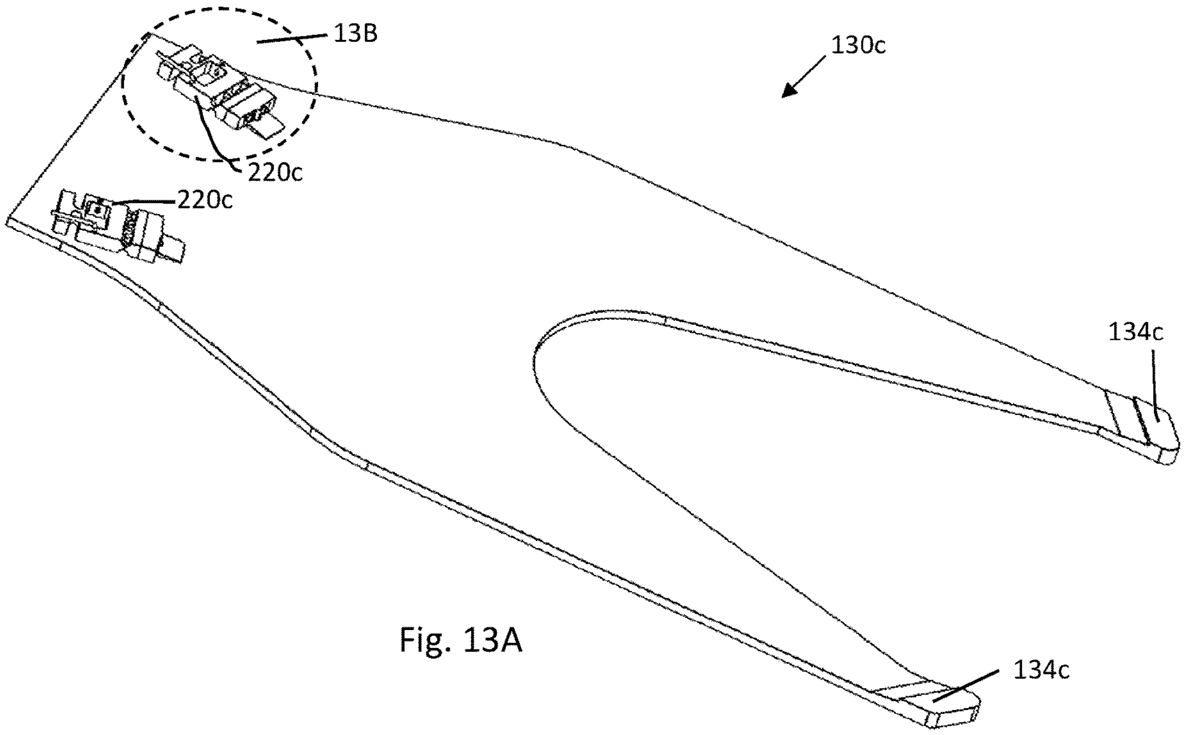
FIG. 13A shows a perspective view of a hand in accordance with another aspect of the present disclosure.
Figure 13B:
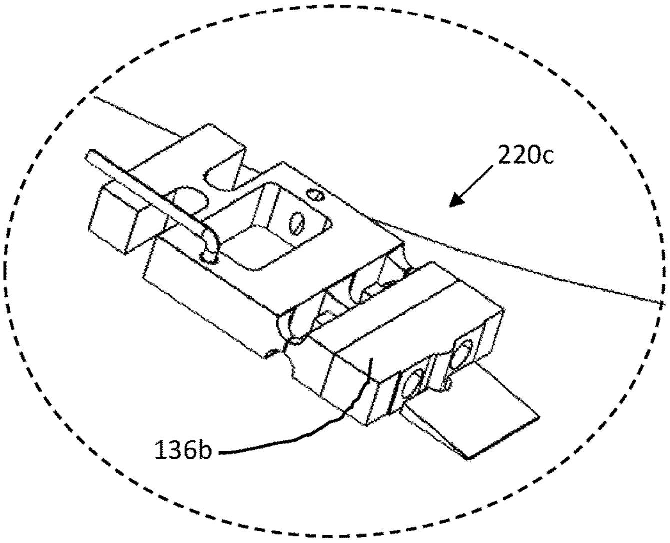
FIG. 13B shows a close up of portion 13B of FIG. 13A.

In conjunction with contacting the substrate 102 with the first protrusion 204 as described above, the hand 130 may include a contact mechanism. FIG. 11A shows perspective view of a hand 130*a* having a contact mechanism 220*a* in accordance with a first example embodiment. FIG. 11B shows a close-up view of the portion 11B of FIG. 11A. FIG. 12A shows perspective view of a hand 130*b* having a contact mechanism 220*b* in accordance with a second example embodiment. FIG. 12B shows a close-up view of the portion 12B of FIG. 12A. FIG. 13A shows perspective view of a hand 130*c* having a contact mechanism 220*c* in accordance with a third example embodiment. FIG. 13B shows a close-up view of the portion 13B of FIG. 13A.

Turning to FIGS. 11A and 11B, the hand 130*a* holds the substrate 102 as described above. The hand 130*a* may include sloped surfaces on fingers 134*a* that the substrate 102 rests upon. The contact mechanism 220*a* of the hand 130*a* may be one or more contact pads. In the illustrated example embodiment of FIGS. 11A and 11B, the contact mechanism 220*a* includes two contact pads. Each contact pad may include a contact edge 138*a* for contacting an edge of the substrate 102. The contact edge 138*a* may have a circular shape as illustrated or may have other shapes such as triangle. Each contact pad serves the function of being a backstop for the substrate 102 when the substrate 102 is being pressed against the first protrusion 204 of the engagement mechanism. That is, as the substrate 102 is continually pressed against the first protrusion 204 of the engagement mechanism 200 at the finger 134*a* end of the hand 130*a*, the substrate 102 will be pushed in the opposite direction toward the compliance mechanism/contact pads. Once the opposite end of the substrate 102 (i.e., the end of the substrate 120 opposite the notch 132), comes into contact with the contact mechanism 220*a*, the substrate 102 can no longer move rearward and the substrate 102 can no longer further rotate. In the first case described above, the first protrusion 204 will fit directly into the notch 132 without rotation of the substrate 102 so the rear end of the substrate 102 will contact both the contact pads 220 at the same time. In the second case described above, the rear end of the substrate 102 will contact one of the contact pads first. Then, as force is continued to be applied by the hand 130*a*, the substrate 102 will rotate/slide while approaching the other contact pad. Once the substrate 102 reaches the other contact pad, the substrate 102 will be properly aligned with the first protrusion 104 within the notch 132. In the third case described above, an error will be detected by the hand 130*a* and the hand will retry or the substrate will be returned to a holding position.

Turning to FIGS. 12A and 12B, the hand 130*b* holds the substrate 102 as described above. The hand 130*b* may include fingers 134*b* that the substrate 102 rests upon. The contact mechanism 220*b* of the hand 130*b* may be one or more compliant contact pads including a spring-loaded plunger 138*b*. In the illustrated example embodiment of FIGS. 12A and 12B, the contact mechanism includes two contact pads. Each contact pad may include the spring-loaded plunger 138*b* for contacting an edge of the substrate 102. The spring-loaded plunger 138*b* may have a predetermined spring force based on the amount of force that is applied during the contact of the first protrusion 204 with the inner edge of the notch 132. The predetermined spring force is less than a force that would cause the motion control system that is moving the hand to have a position following errors that are large enough to disrupt the motion control system. Each contact pad serves the function of being a backstop for the substrate 102 when the substrate 102 is being pressed against the first protrusion 204 of the engagement mechanism 200. That is, as the substrate 102 is continually pressed against the first protrusion 204 of the engagement mechanism 200 at the finger 134*a* end of the hand 130*a*, the substrate 102 will be pushed in the opposite direction toward the contact mechanism 220*b*. Once the opposite end of the substrate 102 (i.e., the end of the substrate 120 opposite the notch 132), comes into contact with the compliance mechanism 220*b*, the substrate 102 will cause the spring loaded plunger 138*b* to compress. In the first case described above, the first protrusion 204 will fit directly into the notch 132 without rotation of the substrate 102 so the rear end of the substrate 102 will contact both the contact pads at the same time and compress both of the spring-loaded plungers 138*b* at the same time. In the second case described above, the rear end of the substrate 102 will contact one of the contact pads first, thereby compressing one of the spring-loaded plungers 138*b*. Then, as force is continued to be applied by the hand 130*a*, the substrate 102 will rotate while approaching the other contact pad. Once the substrate 102 reaches the other contact pad, and compresses the other spring-loaded plunger 138*b*, the substrate 102 will be properly aligned with the first protrusion 104 within the notch 132 and the substrate 102 can no longer further rotate. By using spring-loaded plungers, the force on the substrate is reduced, which reduces the likelihood of the substrate breaking. In the third case described above, an error will be detected by the hand 130*a* and the hand will retry or the substrate will be returned to a holding position.

Turning to FIGS. 13A and 13B, the hand 130*c* holds the substrate 102 as described above. The hand 130*c* may include fingers 134*b* that the substrate 102 rests upon. The contact mechanism 220*c* of the hand 130*c* may be one or more compliant load cells. In the illustrated example embodiment of FIGS. 13A and 13B, the contact mechanism includes two complaint load cells. Each load cell may be configured to contact an edge of the substrate 102 and measure the contact force between the contact mechanism 220*c* and substrate 102. Each contact mechanism 220*c* serves the function of being a backstop for the substrate 102 when the substrate 102 is being pressed against the first protrusion 204 of the engagement mechanism 200, while also measuring the force on the load cell. That is, as the substrate 102 is continually pressed against the first protrusion 204 of the engagement mechanism 200 at the finger 132*c* end of the hand 130*c*, the substrate 102 will be pushed in the opposite direction toward the contact mechanism 220*c*. Once the opposite end of the substrate 102 (i.e., the end of the substrate 120 opposite the notch 132), comes into contact with the contact mechanism 220*c*, the substrate 102 can no longer move rearward and the substrate 102 can no longer further rotated. In the first case described above, the first protrusion 204 will fit directly into the notch 132 without rotation of the substrate 102 so the rear end of the substrate 102 will contact both the load cells at the same time. In the second case described above, the rear end of the substrate 102 will contact one of the load cells first. Then, as force is continued to be applied by the hand 130*c*, the substrate 102 will rotate while approaching the other load cell. Once the substrate 102 reaches the other load cell, the substrate 102 will be properly aligned with the first protrusion 104 within the notch 132. By having load cells, the force being applied to the contact mechanism 220*c* by the substrate 102 can be measured. The amount of force that would be applied to each of the load cells during a rotation of the substrate 102 (i.e., the second case) is known as compared to the force that would be applied to each of the load cells when the first protrusion 204 is too far off from the notch 132 (i.e., the third case) and as compared the force that would be applied to each of the load cell when the first protrusion 204 is precisely aligned with the notch 132. Thus, the feedback from the contact pads can inform operator whether the first case, the second case, or the third case is occurring. For example, by comparing the forces the load cells an operator or a controller knows if the notch 132 is misaligned with the first protrusion 204. A difference in forces on the loadcells may indicate that the substrate 102 is rotating about the notch 132 into the correct position. The load cell may also prevent accidental breakage of the substrate 102 by limiting the amount force applied to the substrate during loading of the substrate onto the mounting pins 114.

In an embodiment it is also possible for there to be no contact mechanism. In such a case the friction between the underside of the substrate and the upper side of the hand would be relied upon to ensure that the substrate is able to engage with the first protrusion of the engagement mechanism.

Figure 26:
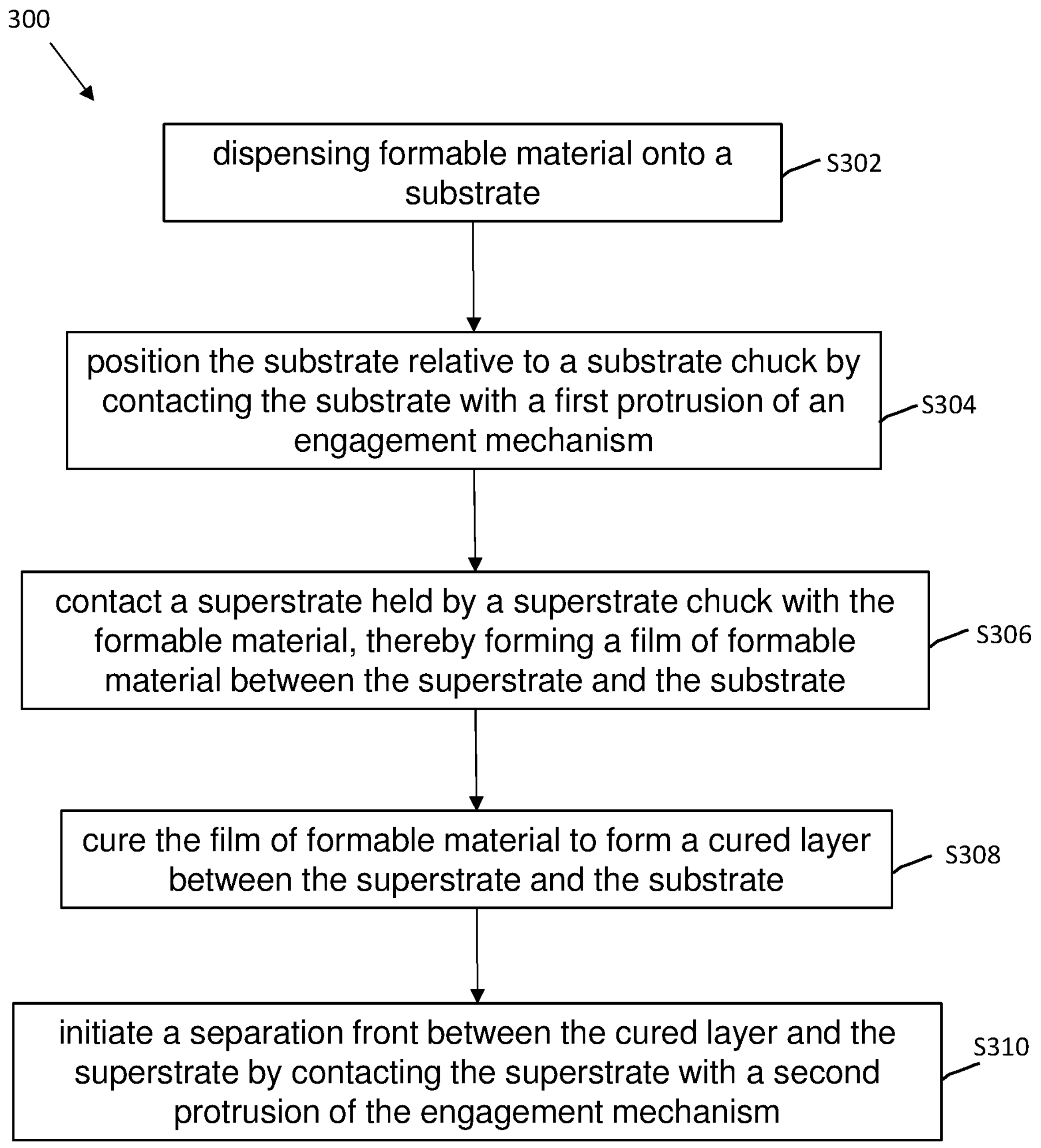
FIG. 26 is a flow chart showing a planarizing method, in accordance with an aspect of the present disclosure.

FIGS. 14A to 25 illustrate various moments during a planarizing method 300 according to an aspect of the present disclosure. FIG. 26 shows a flow chart of the planarizing method 300. The method 300 begins with a step S302 of dispensing the formable material onto the substrate. The dispensing of the formable material is the same as discussed above. Next, the method may proceed to step S304 where the substrate is positioned relative to the substrate chuck by contacting the substrate with the first protrusion of the engagement mechanism.

Figure 14A:
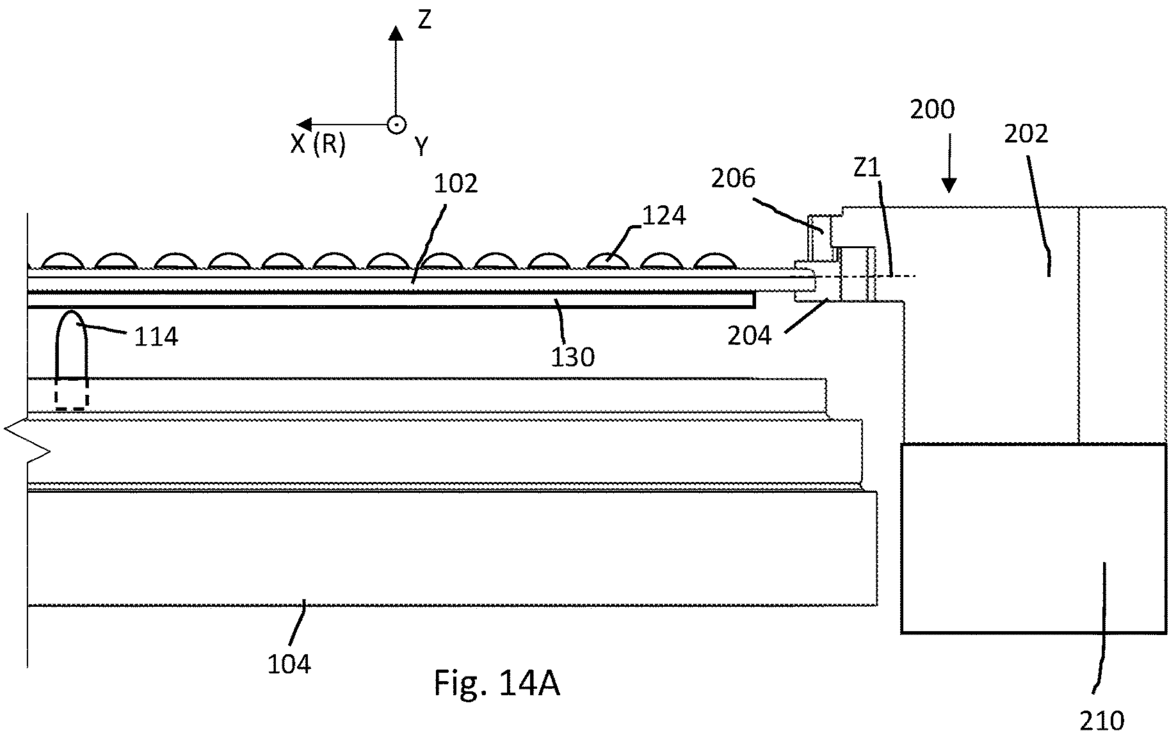
FIG. 14A shows a partial side view of the substrate chuck and the engagement mechanism when the engagement mechanism is engaged with the notch of the substrate, in accordance with an aspect of the present disclosure.
Figure 14B:
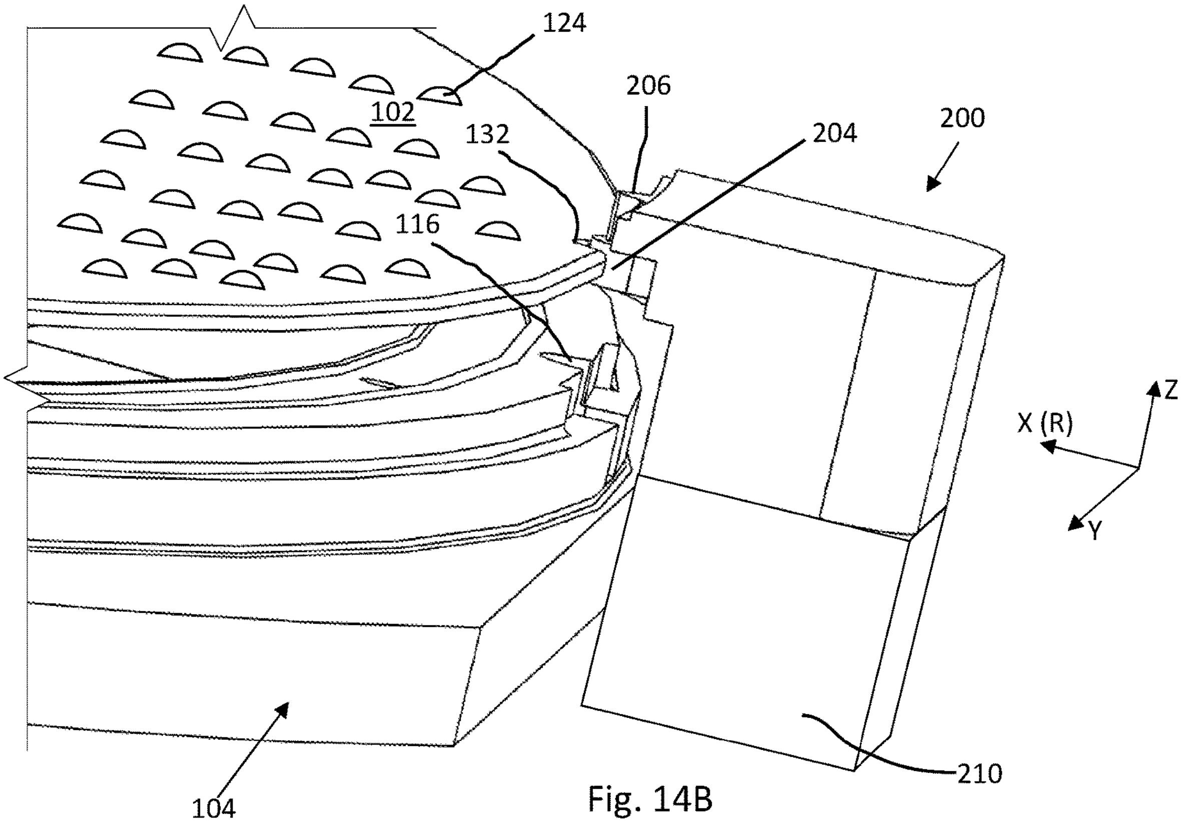
FIG. 14B shows a partial perspective view of the substrate chuck and the engagement mechanism when the engagement mechanism is engaged with the notch of the substrate, in accordance with an aspect of the present disclosure.

FIGS. 14A and 14B show the moment after performing step S304. FIG. 14A shows a partial side view of the moment when the process of fully engaging the notch 132 with the first protrusion 204 of the engagement mechanism 200 has been completed. FIG. 14B shows a partial perspective view of the moment of FIG. 14A. This moment shown in FIGS. 14A and 14B is the end result following the first case and the second cases described above. As shown in FIGS. 14A and 14B, the engagement mechanism 200 is in the elevated position and the first protrusion 204 is completely engaged with the notch 132 of the substrate 102. Once the moment in FIGS. 14A and 14B is reached, the substrate 102 is properly positioned relative to the substrate chuck 104.

Once the position in FIGS. 14A and 14B has been reached, i.e., after the substrate 102 has been properly positioned relative to the substrate chuck 104, the hand 130 lowers the substrate 102 onto the pins 114. That is, the hand 130 holding the substrate 102 is moved downwardly in the Z direction only. At the same time, the engagement mechanism 200 is maintained at the extended position. Accordingly, the notch 132 of the substrate 102 remains engaged with the first protrusion 204 of the engagement mechanism 200 as the substrate 102 is lowered in the Z direction via downward movement of the hand 130. In an alternative embodiment, the engagement mechanism 200 moves in the z direction along with the hand 130. In another alternative embodiment, the pins 114 are raised until they contact the substrate, the hand is then lowered and moved out of the way.

Figure 15:
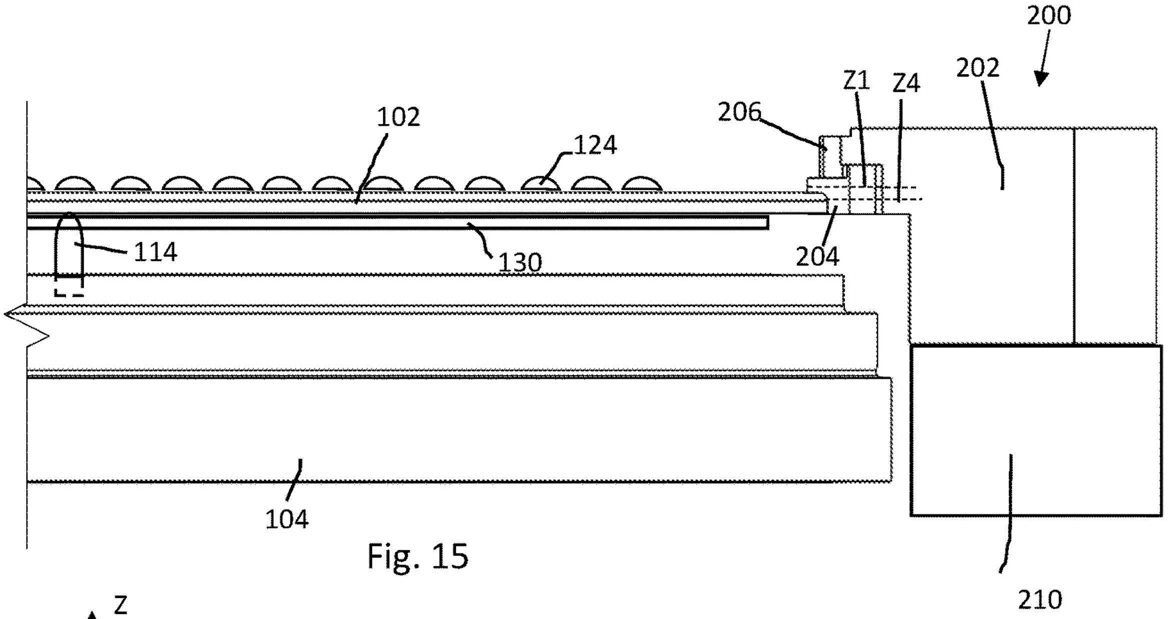
FIG. 15 is a partial side view of the substrate chuck and the engagement mechanism when the substrate has been lowered onto mounting pins, in accordance with an aspect of the present disclosure.

FIG. 15 is a side view of the substrate 102, substrate chuck 104, and engagement mechanism 200, after the substrate 102 has been moved downwardly in the Z direction to the point of contacting the mounting pins 114. As shown in FIG. 15, the underside surface of the substrate 102 is in contact with the mounting pins 114 and the notch 132 is still engaged with the first protrusion 204 of the engagement mechanism. As best seen by comparing FIG. 14A to FIG. 15, the substrate 102 has been lowered from a relatively higher Z direction position Z1 to lower Z direction position Z4 while the first protrusion 204 is still engaged with the notch 132. The difference between Z1 and Z4 may be from 0.1 to 5 mm.

Figure 16:
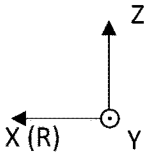
FIG. 16 is a partial side view of the substrate chuck and the engagement mechanism when the hand has been removed, in accordance with an aspect of the present disclosure.
Figure 16:
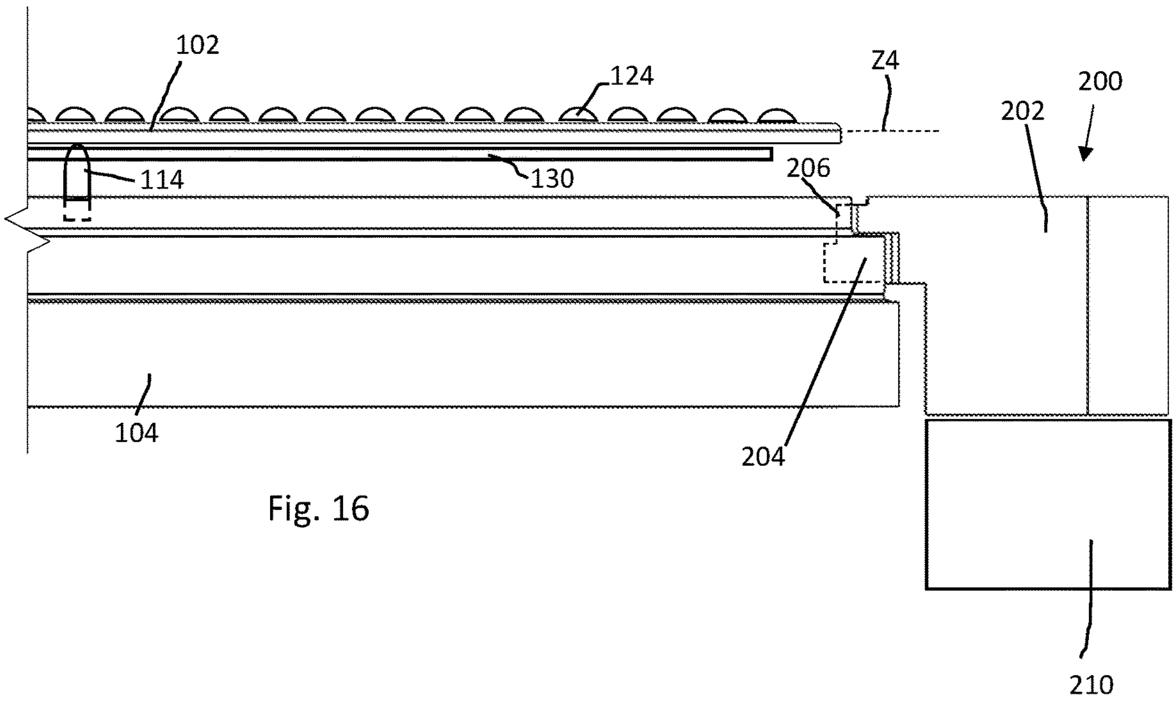

FIG. 16 is a side view of the substrate 102, the substrate chuck 104, and the engagement mechanism 200, after the engagement mechanism 200 has been fully lowered in the Z direction back to the retracted position. As shown in FIG. 16, in the retracted position, the engagement mechanism 200 has returned to the original position where the first protrusion 204 and the second protrusion 206 are within the notch 116 of the substrate chuck 104. That is, the engagement mechanism 200 is back to the position shown in FIG. 4C. At the same time, the substrate 102 and hand 130 have not moved so that the substrate 102 is still at the same Z position Z4 as the moment of FIG. 15.

Figure 17:
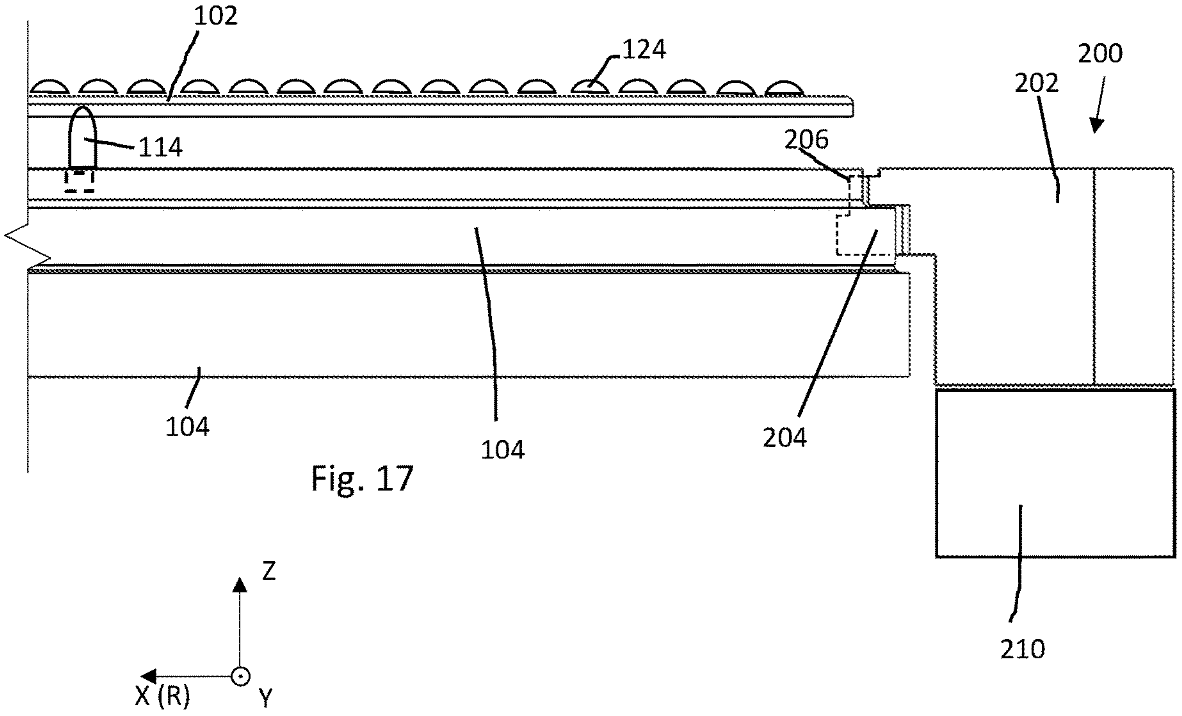
FIG. 17 is a partial side view of the substrate chuck and the engagement mechanism when the engagement mechanism has been lowered to a retracted position, in accordance with an aspect of the present disclosure.

With the substrate 102 on the mounting pins 114, and the engagement mechanism 200 retracted, the hand 130 may then be removed. FIG. 17 show a side view of the substrate 102, substrate chuck 104, and engagement mechanism 200 after the hand 130 has been removed. The hand 130 may be removed via the robot arm. As shown in FIG. 17 the hand 130 has been removed while the substrate 102 is still on top of the mounting pins 114. Furthermore, the engagement mechanism 200 is in the same position.

Figure 18:
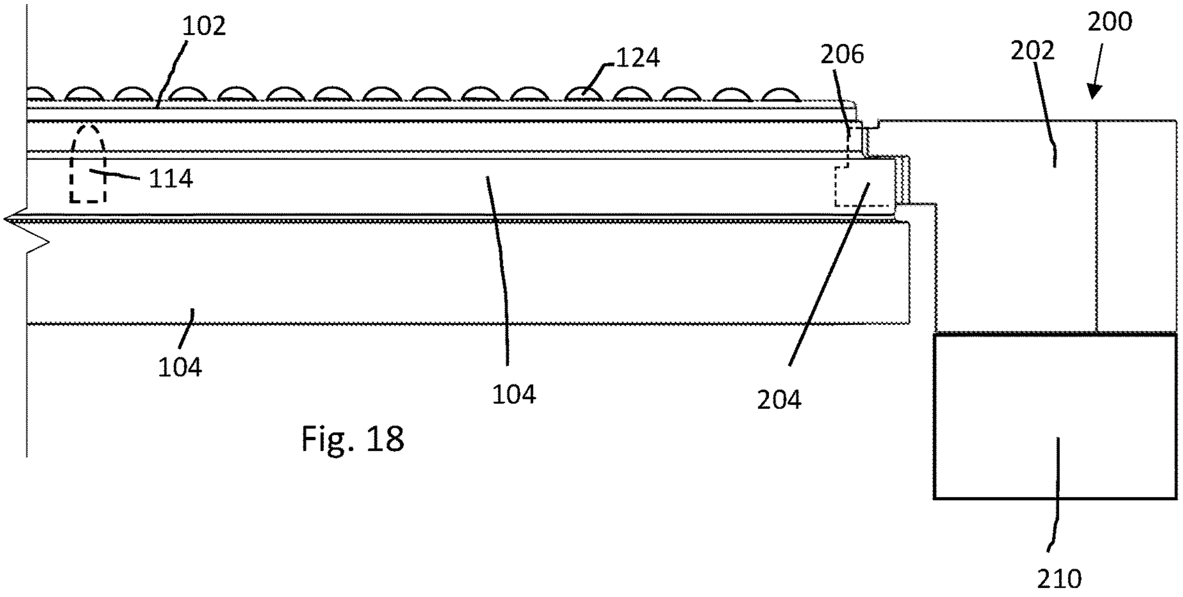
FIG. 18 is a partial side view of the substrate chuck and the engagement mechanism when the substrate has been lowered onto the substrate chuck, in accordance with an aspect of the present disclosure.

Next, the mounting pins 114 are lowered so that the substrate 102 is also lowered and then coupled with the substrate chuck 104. The mounting pins 114 may provide vacuum to prevent the substrate from shifting while it is being lowered onto the substrate chuck 104 and/or the engagement mechanism 200 is being lowered. FIG. 18 shows a side view of the substrate 102, the substrate chuck 104, and the engagement mechanism 200 after the substrate 102 has been lowered by lowering the mounting pins 114. As shown in FIG. 18, the mounting pins 114 have been lowered and the underside of the substrate is in contact with the substrate chuck 104. The substrate 102 may be coupled with the substrate chuck by a vacuum in an example embodiment.

Figure 19:
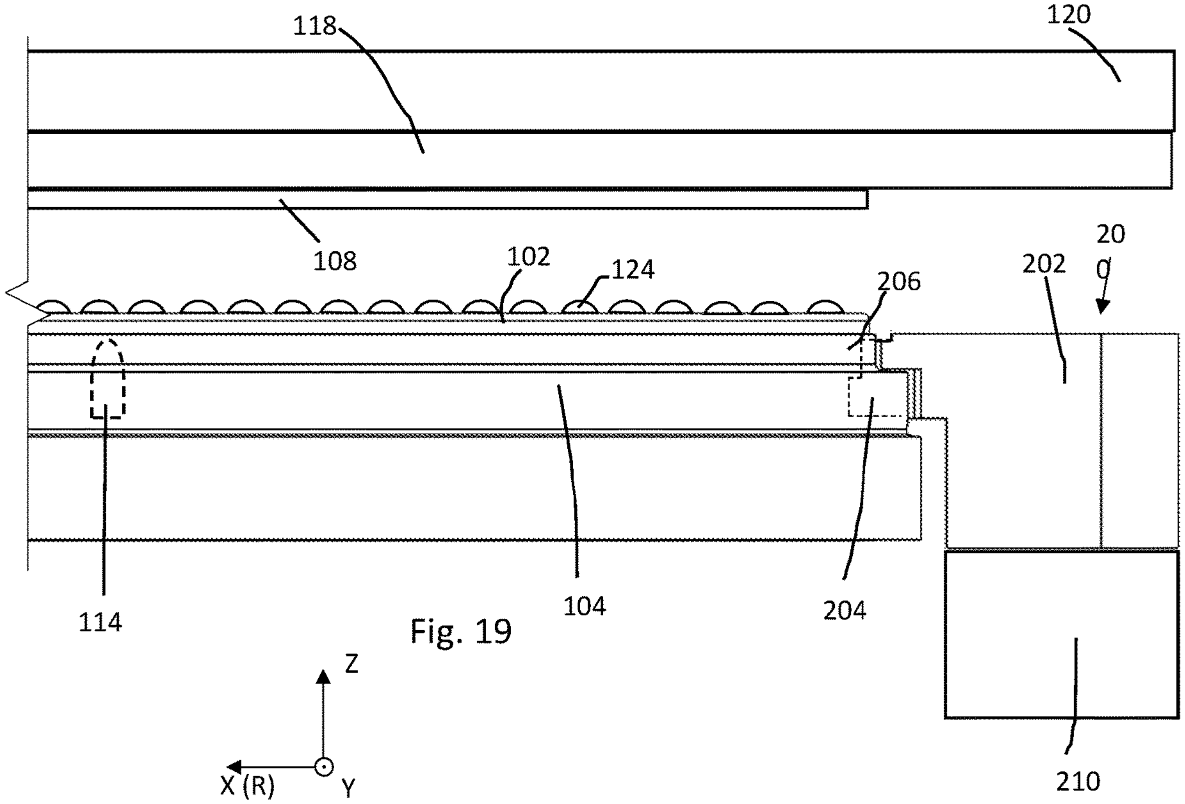
FIG. 19 is a partial side view of the substrate chuck and the engagement mechanism when substrate has been brought underneath a planarization head, in accordance with an aspect of the present disclosure.

With the substrate 102 coupled with the substrate chuck 104, the planarization of the formable material 124 on the substrate 102 may begin. This part of the process may begin by moving the substrate chuck 102 holding the substrate 102 underneath the planarization head 120. Alternatively, the substrate chuck 104 may already be underneath the planarization head 120 at the time of performing the prior steps of positioning and placing the substrate 102 on the substrate chuck 104. FIG. 19 shows a partial side view of the substrate 102, the substrate chuck 104, the engagement mechanism 200, and the planarization head 120 at after the substrate chuck 104 holding the substrate 102 has been positioned underneath the planarization head 120. As shown in FIG. 19, and discussed above, the superstrate chuck 118 is coupled to the planarization head 120 and the superstrate 108 is coupled to or retained by the superstrate chuck 118. At the moment shown in FIG. 19, when the substrate 102 and the substrate chuck 104 are positioned under the planarization head 120, all of the elements are the same apposition as in the moment shown in FIG. 18. That is, the substrate 102 is still coupled with the substrate chuck 102 and the engagement mechanism 200 is still retracted such that the first protrusion 204 and the second protrusion 206 are located in the notch 116 of the substrate chuck 104.

Figure 20:
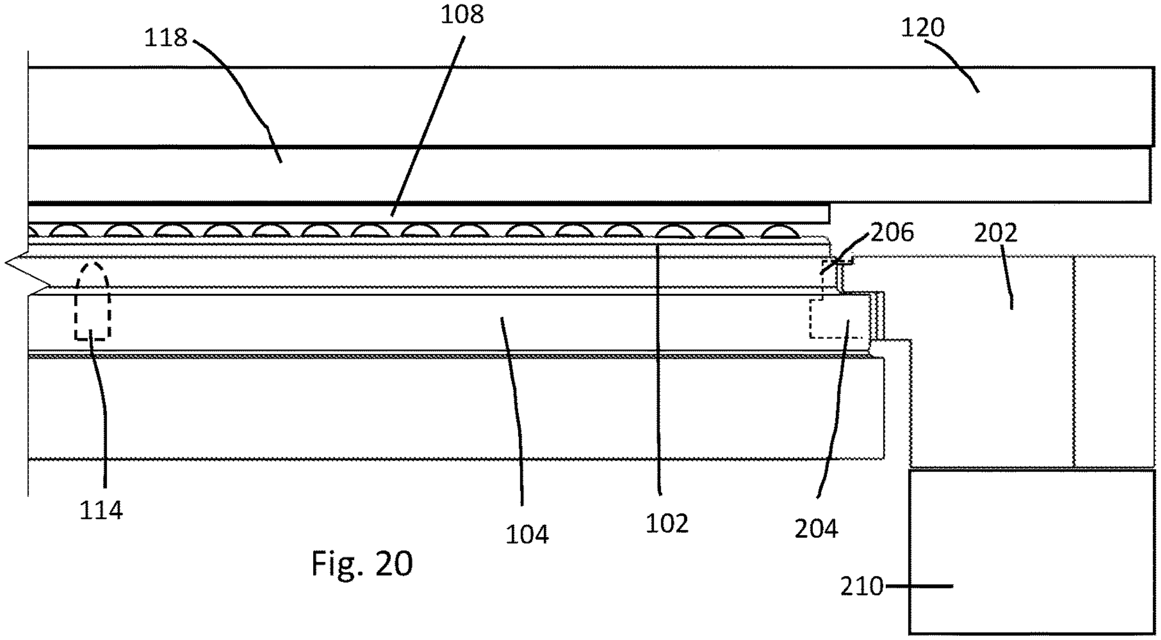
FIG. 20 is a partial side view of the substrate chuck and the engagement mechanism when a superstrate has been lowered to contact formable material on the substrate, in accordance with an aspect of the present disclosure.

After being positioned under the planarization head 120, the method may then proceed to moving the planarization head 120 and/or the substrate chuck 104 until the superstrate comes into contact with the formable material 124 on the substrate 102. That is, the method may proceed to step S306 where the superstrate held by the superstrate chuck contacts the formable material, thereby forming a film of formable material between the superstrate and the substrate. This is the same process discussed above with respect to FIGS. 2A and 2B. FIG. 20 shows a partial side view of the substrate 102, the substrate chuck 104, the engagement mechanism 200, and the planarization head 120 just as the superstrate 108 begins to come into contact with the formable material 124. At the moment shown in FIG. 20, the formable material 124 has not yet formed a film. As seen in FIG. 20, the engagement mechanism 200 is still retracted such that the first protrusion 204 and the second protrusion 206 are located in the notch 116 of the substrate chuck 104.

Figure 21:
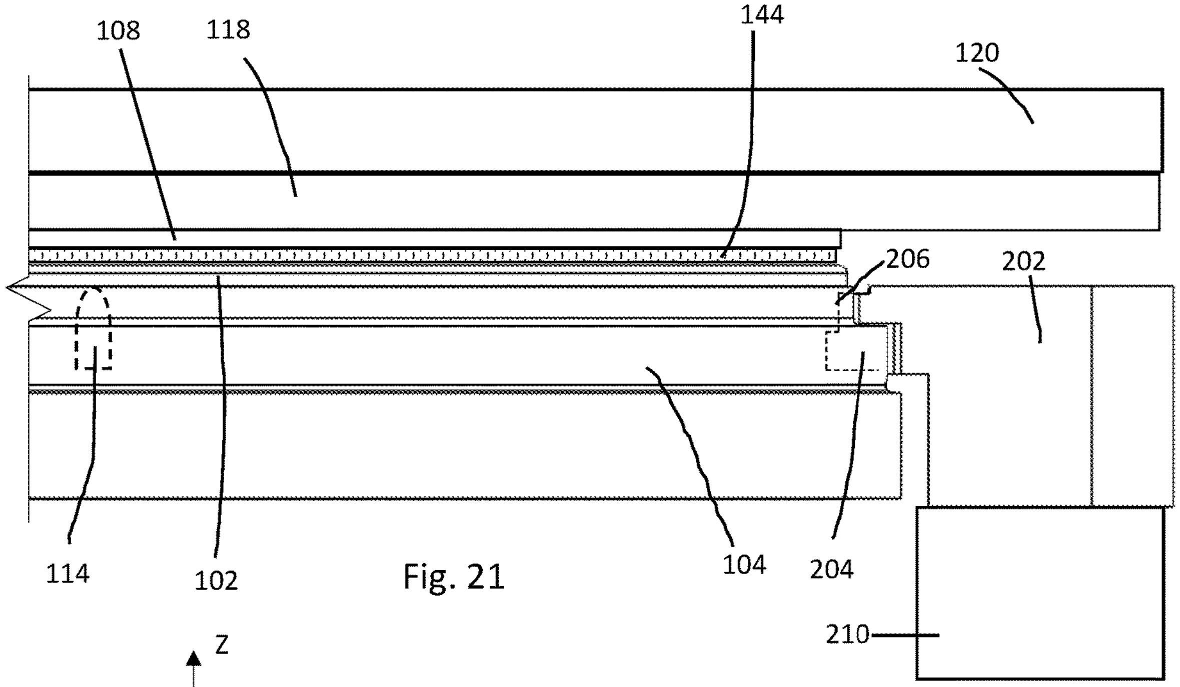
FIG. 21 is a partial side view of the substrate chuck and the engagement mechanism when the superstrate has formed a film layer between the superstrate and the substrate, in accordance with an aspect of the present disclosure.

FIG. 21 shows a partial side view of the substrate 102, the substrate chuck 104, the engagement mechanism 200, and the planarization head 120 after the superstrate 108 has fully come into contact with the formable material 124 and forms the film 144. At the moment shown in FIG. 21, the film 144 has been formed between the superstrate 108 and the substrate 102. As seen in FIG. 21, the engagement mechanism 200 is still retracted such that the first protrusion 204 and the second protrusion 206 are located in the notch 116 of the substrate chuck 104.

Figure 22:
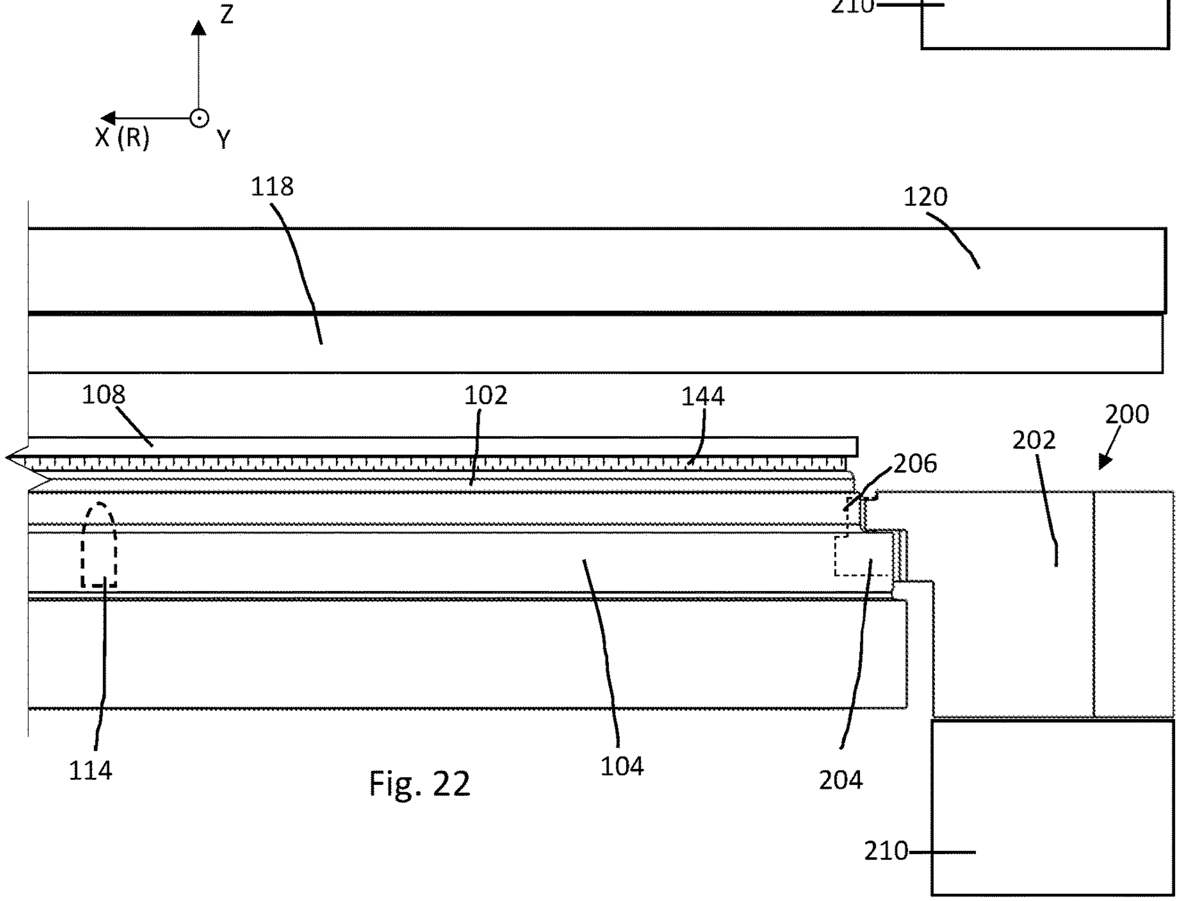
FIG. 22 is a partial side view of the substrate chuck and the engagement mechanism when the superstrate has been released from the planarization, in accordance with an aspect of the present disclosure.

After forming the film 144, the superstrate 108 is released from the superstrate chuck 118. FIG. 22 shows a partial side view of the substrate 102, the substrate chuck 104, the engagement mechanism 200, and the planarization head 120 after the superstrate 108 has been released from the superstrate chuck 118. At the moment shown in FIG. 22, the superstrate 108, the film 144, and the substrate 102 are on the substrate chuck 104 and free of the planarization head 120. As seen in FIG. 22, the engagement mechanism 200 is still retracted such that the first protrusion 204 and the second protrusion 206 are located in the notch 116 of the substrate chuck 104.

Figure 23:
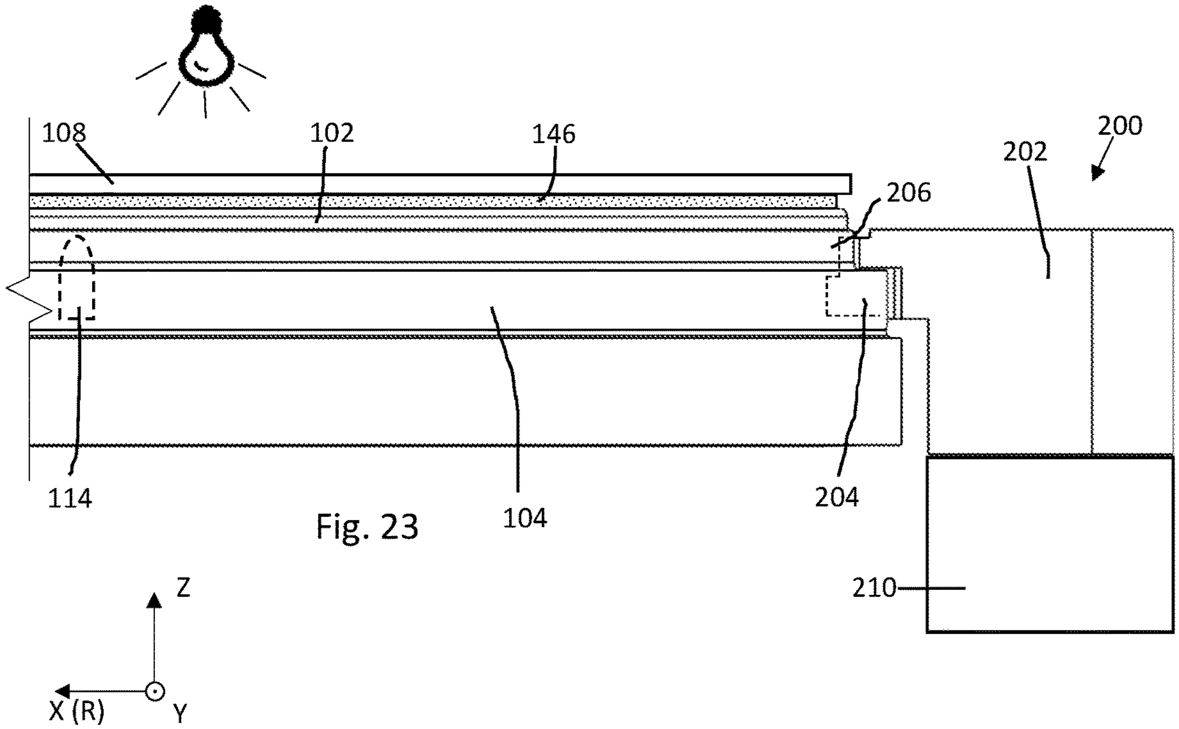
FIG. 23 is a partial side view of the substrate chuck and the engagement mechanism when the film layer between the superstrate and the substrate is cured to form a cured layer, in accordance with an aspect of the present disclosure.

Next, the method may proceed to step S308 where the film of formable material is cured to form a cured layer between the superstrate and the substrate. The superstrate 108, the film 144, and the substrate 102 are brought to the curing station 107. At the curing station 107, the curing process discussed above is performed. That is, actinic energy, for example, UV light radiation, is directed to the film 144 until it the cured layer 146 is formed. FIG. 23 shows a partial side view of the substrate 102, the substrate chuck 104, the engagement mechanism 200 at the curing station 107 after the film 144 has be cured into the cured layer 146. As seen in FIG. 23, the cured layer 146 is between the superstrate 108 and the substrate 102.

Figure 24:
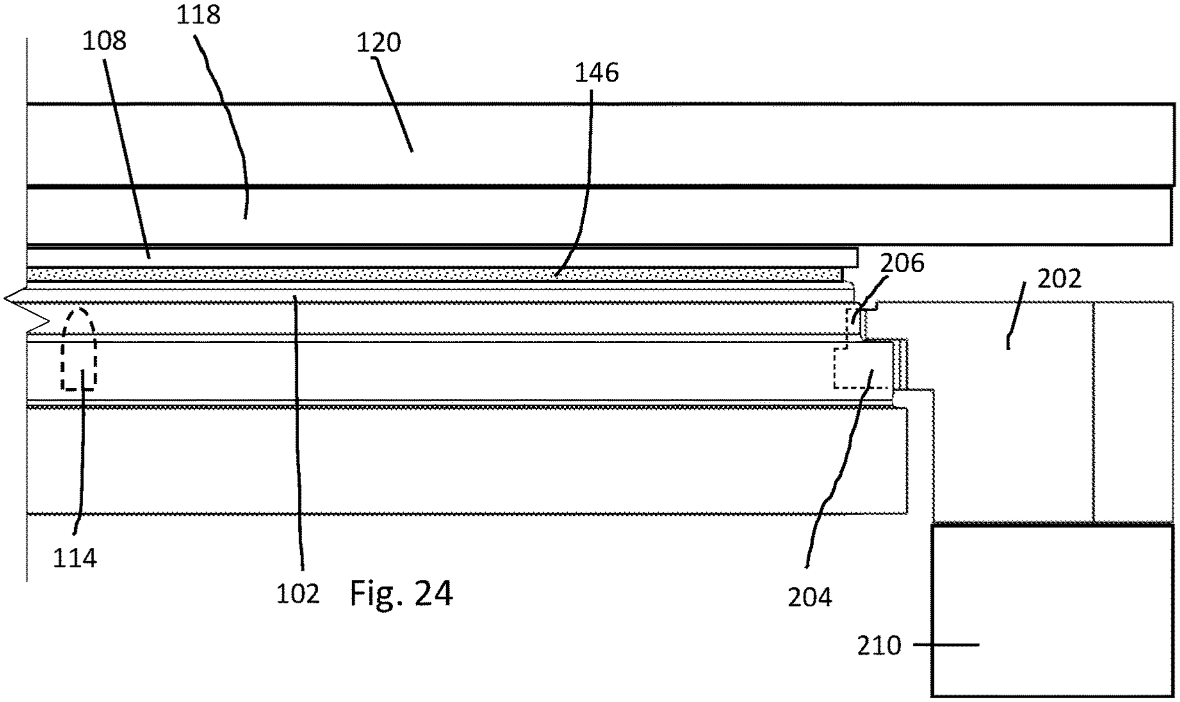
FIG. 24 is a partial side view of the substrate chuck and the engagement mechanism when the superstrate contacting the cured layer is recoupled with the planarization head, in accordance with an aspect of the present disclosure.

After the cured layer 146 has been formed, the superstrate 108, the cured layer 146, and the superstrate 108 are brought back to the planarizing station 105. At the planarizing station the superstrate 108, while still in contact with the cured layer 146, is recoupled with the superstrate chuck 118. As illustrated in FIG. 24 when the superstrate 108 is initially coupled with the superstrate chuck 118, the engagement mechanism 200 is still retracted such that the first protrusion 204 and the second protrusion 206 are located as show in a partial side view of the substrate 102, the substrate chuck 104, the engagement mechanism 200, and the planarization head 120 after the superstrate 108 has been recoupled with the superstrate chuck 118. As seen in FIG. 24, the cured layer 146 is still between the superstrate 108 and the substrate in the notch 116 of the substrate chuck 104. In an alternative embodiment, the cured layer is formed while the superstrate is under the planarization head 120.

With the superstrate 108 coupled to the superstrate chuck, the method may then proceed to releasing the superstrate 108 from the cured layer 146. That is, the method may proceed to step S310 where a separation front is initiated between the cured layer and the superstrate by contacting the superstrate with a second protrusion of the engagement mechanism. In an alternative embodiment, step S304 is performed prior to step S302, when the dispensing of step S302 is performed on the same substrate chuck 104 as the separation of the superstrate from the formable material of step S310. As part of assisting in releasing the superstrate 108 from the cured layer 146, the engagement mechanism 200 is once again implemented. Because of the notch 132 in the substrate 102, the second protrusion 102 is positioned underneath the superstrate 108. That is, as noted above, and shown in FIG. 24, just prior to the step of releasing the superstrate 108 from the cured layer 146, the engagement mechanism 200 is still in the retracted position with the first protrusion 204 and the second protrusion 206 in the notch 116 of the substrate chuck 104. When the engagement mechanism 200 is in this position, as also shown in FIG. 24, the second engagement mechanism 200 is positioned just underneath the notch 132 of the substrate. As noted above, the second protrusion 206 is shaped and sized so that it can pass through the notch 132 when traveling in the Z direction without touching the edges that define the notch 132. Because the notch 132 is formed in the substrate 102, the cured layer 146, being formed on the surface of substrate 102, is not present over the notch 132 of the substrate 102. The superstrate 108 is on top of the cured layer 146 and extends all the way to the edge of the substrate 102, including covering the notch 132. Because of this arrangement, the second protrusion 206 of the engagement mechanism 200 is located below the superstrate 102 and can directly impinge upon the underside of the superstrate 108 passing through the notch 132 of the substrate 102. That is, as part of the step of separating the superstrate 108 from the cured layer 146, the engagement mechanism 200 may extend upwardly in the Z direction toward the superstrate 108. As the engagement mechanism 200 rises, the second protrusion 206 passes through the notch 132 and eventually reaches the underside of the superstrate 108. The engagement mechanism 200 may continue to rise in the Z direction thereby applying an upward force on the edge of the superstrate 108 that is just above the notch 132, thereby initiating a separation front between the superstrate 108 and the cured layer 146. Once the separation front has been initiated the separation front can be propagated through other techniques such as lifting and/or angling the superstrate chuck 118. The superstrate chuck 118 may be a flex chuck that allows it to retain the superstrate while the superstrate 108 is bent by second protrusion 206.

FIG. 25 shows a partial side view of the substrate 102, the substrate chuck 104, the planarization head 120, and the engagement mechanism 200 after the engagement mechanism 200 has been elevated in the Z direction to push up on the superstrate 108. As seen in FIG. 25, the upper side of the second protrusion 206 is pushing up upon the underside of the superstrate 108 such that the superstrate 108 is partially lifted off of the cured layer 146.

As described above, because the engagement mechanism 200 includes the first protrusion 204 and the second protrusion 206, being particularly shaped and sized based on the shape and size of the notch 132 of the substrate 102, the engagement mechanism 200 is able to both 1) assist is mechanically positioning the substrate 102 relative to the substrate chuck 104 at the time of coupling the substrate 102 with the substrate chuck 104 and 2) assist with separating the superstrate 108 from the cured layer 146. In summary, the first protrusion 204 is sized and shaped to engage with the notch 132, which the second protrusion 206 is sized and shaped to pass completely through the notch 132. This method also ensures that the second protrusion 210 is always in the proper place when performing separation and there is never any chance of the second protrusion touching the substrate.

After initiating the separation front in the manner described above, the method may continue through any known process of completely separating the superstrate 108 from the cured layer 246. For example, the method for separating a superstrate from a cured layer described in U.S. Pat. App. Pub. No. 2022/0011342 may implemented, which is hereby incorporated by reference herein. After complete separation, the substrate and the cured layer may then be subjected to additional known steps and processes for device (article) fabrication, including, for example, patterning, curing, oxidation, layer formation, deposition, doping, planarization, etching, formable material removal, dicing, bonding, and packaging, and the like. The substrate may be processed to produce a plurality of articles (devices).

FIGS. 27A to 27D show another example embodiment of an engagement mechanism 400. The engagement mechanism 400 is similar to the engagement mechanism 200 discussed above, except that in the engagement mechanism 400 the second protrusion extends farther than the first protrusion in the radial direction. In the engagement mechanism 200 the first protrusion extends farther in the radial direction than the second protrusion.

Figure 27A:
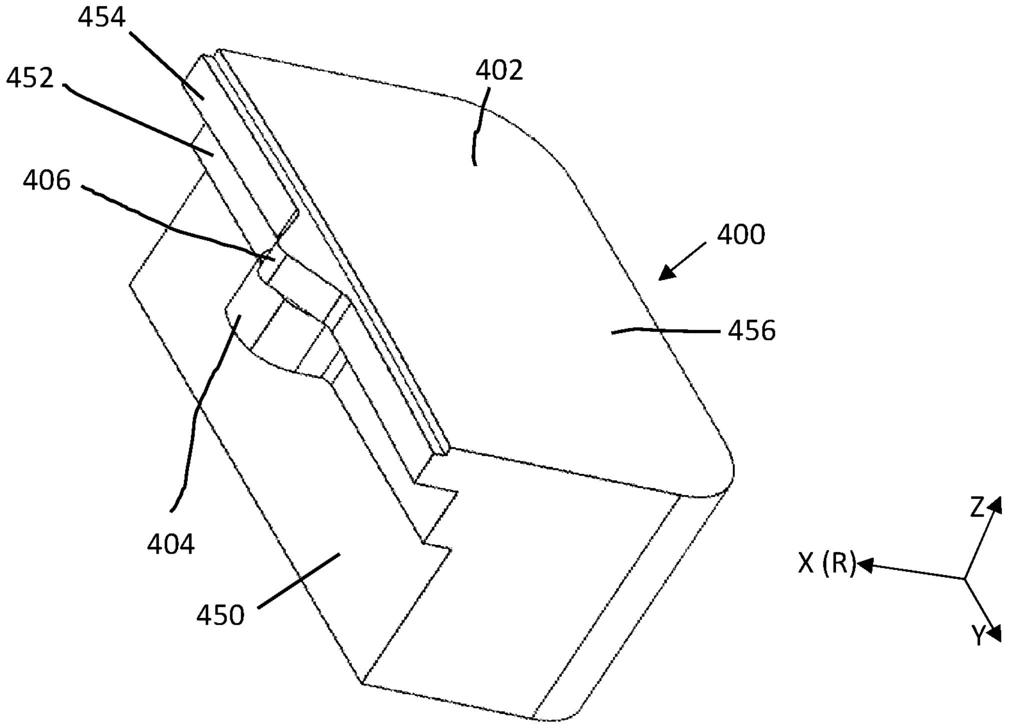
FIG. 27A shows a perspective view of another example engagement mechanism in accordance with an aspect of the present disclosure.
Figure 27B:
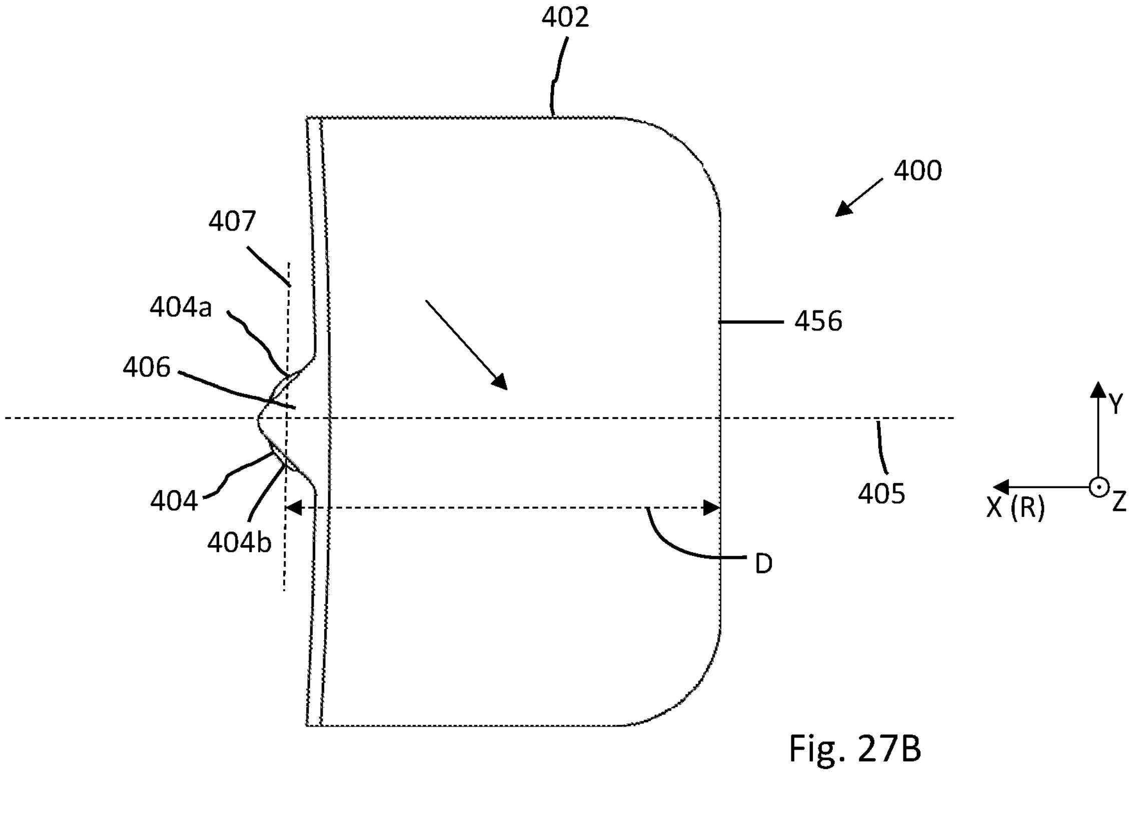
FIG. 27B shows a top view of the example engagement mechanism of FIG. 27A.
Figure 27C:
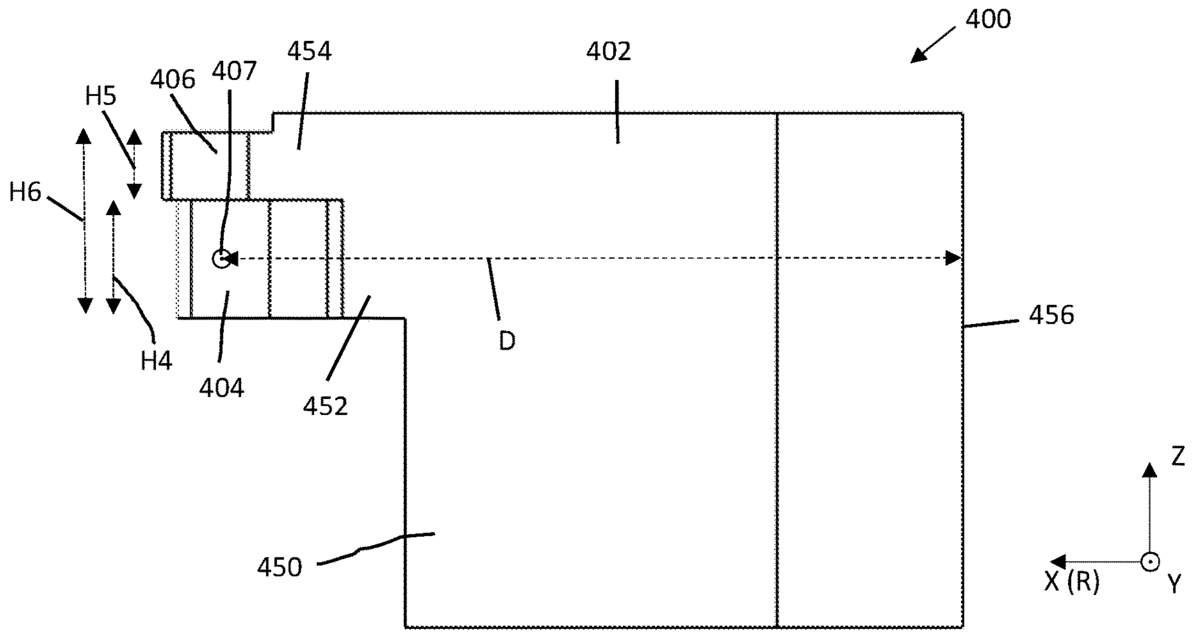
FIG. 27C shows a side view of the example engagement mechanism of FIG. 27A.
Figure 27D:
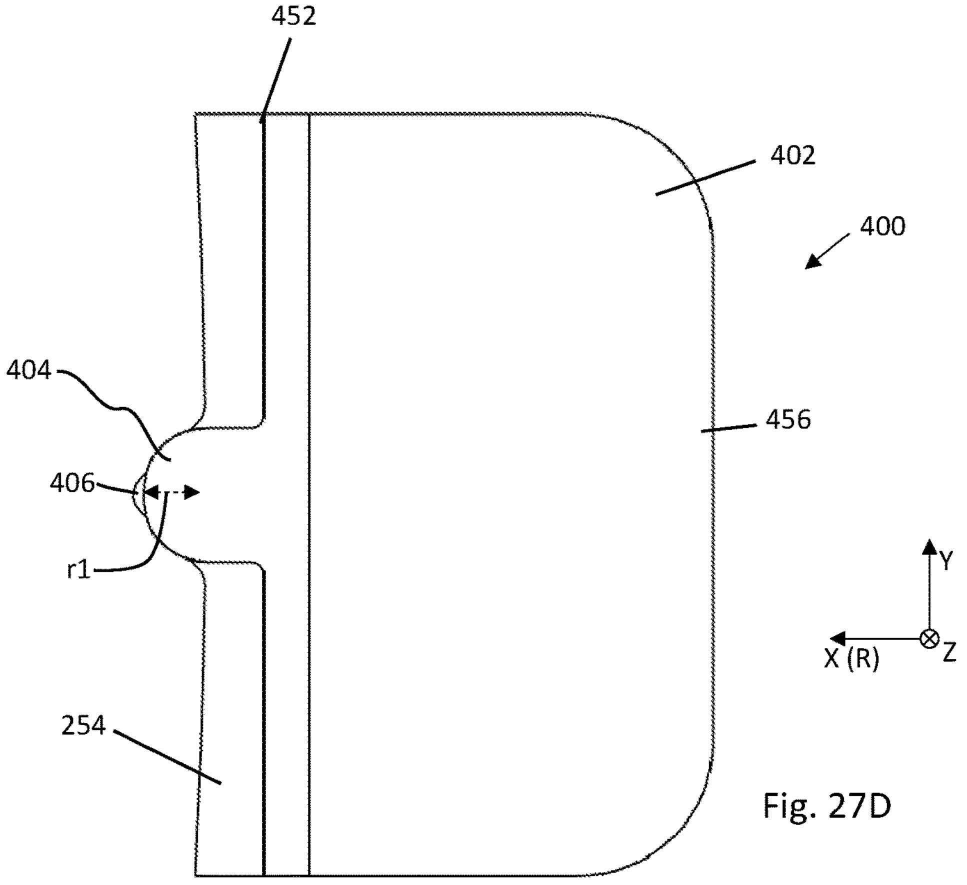
FIG. 27D shows a bottom view of the example engagement mechanism of FIG. 27A.

FIG. 27A shows a perspective view of the engagement mechanism 400 with all other structure of the planarization system omitted. FIG. 27B shows a top view of the engagement mechanism 400. FIG. 27C shows a side view of the engagement mechanism 400. FIG. 27D shows an underside view of the engagement mechanism 400.

The engagement mechanism 400 includes a body 402, a first protrusion 404, and second protrusion 406. As shown in FIGS. 27A-D, the first protrusion 404 has portions that extends farther out from the body 402 than the second protrusion 406. However, the engagement mechanism 400 also includes portions of the first protrusion 404 that do not extend as far out from the body as the second protrusion 406. The second protrusion 406 is positioned above the first protrusion 404 in the orientation shown in FIG. 27A to 27D. The engagement mechanism 400 is configured to be operated in the same manner as the engagement mechanism 200 discussed above, including performing the dual functions of assisting in positioning the substrate and assisting in separate the superstrate from the cured layer.

As best seen in FIGS. 27A and 27C, the body 402 of the engagement mechanism 400 may have a stepped structure. More particularly, the body 402 may include a first portion 450, a second portion 452, and a third portion 454, where each portion extends further from the rear end 456 of the body 402. The first protrusion 404 extends from the second portion 452 and the second protrusion 406 extends from the third portion 454. As noted above, the first protrusion 404 has portions that extend farther than the second protrusion 406. FIG. 27B best shows the portions 404*a*, 404*b* of the first protrusion 404 that extend farther than the second portion 406. More particularly, as shown in FIG. 27B, the portions 404*a*, 404*b* extend farther in the Y direction than corresponding portions of the second protrusion 406. The Y direction in which the portions 404*a*, 404*b* extend further is in a direction perpendicular to a first line 405 extending in the radial direction R through both the first protrusion 404 and the second protrusion 406. That is as shown in FIG. 27B, the first line 405 is a centerline passing through the center of the first protrusion 404 and the second protrusion 406. A second line 407 extends perpendicular to the first line 405. The second line 407 intersects with the first protrusion 404 at two points and the intersects with the second protrusion 406 at corresponding two points. The portions 404*a*, 404*b* of the first protrusion that intersect with the second line 407 are farther from the first line 405 than the portions of the second protrusion that also intersect with the second line 407. In an embodiment, a contact portion of the first protrusion that is intended to engage with a notch in the substrate should extend away from the second protrusion 406 in a direction perpendicular to the contact portion of the first protrusion by at least 0.1 mm.

A distance D from the rear end 456 to the point where the first line 405 intersects with the second line may be the same as in the engagement mechanism 200. As also shown in FIG. 27C, H4 is the height of the first protrusion 404, H2 is the height of the second protrusion H5, and H6 is the height of both protrusions together. H4 of the engagement mechanism 400 corresponds to H1 of the engagement mechanism 200, except that H4 is 1.9 mm. H5 of the engagement mechanism 400 corresponds to H2 of the engagement mechanism 200, except that H5 is 1.1 mm. H6 of the engagement mechanism 400 corresponds to H3 of the engagement mechanism 200 and are the same as each other.

As best seen in FIG. 27D, in the engagement mechanism 400, the second protrusion 406 extends further in radial direction R than the first protrusion 404, which is the opposite of the engagement mechanism 200. However, as discussed above, because the portions 404*a*, 404*b* of the first protrusion 404 extend farther in the Y direction than the second protrusion 406 (as is also the case in the engagement mechanism 200), the first protrusion 404 is still able to engage with the substrate and the second protrusion 406 is still able to lift the superstrate in the same manner as the engagement mechanism 200, without the second protrusion 406 contacting the notch during the positioning of the substrate.

Further modifications and alternative embodiments of various aspects will be apparent to those skilled in the art in view of this description. Accordingly, this description is to be construed as illustrative only. It is to be understood that the forms shown and described herein are to be taken as examples of embodiments. Elements and materials may be substituted for those illustrated and described herein, parts and processes may be reversed, and certain features may be utilized independently, all as would be apparent to one skilled in the art after having the benefit of this description.

What is claimed is:

1. A planarizing method, comprising:
dispensing formable material onto a substrate;
positioning the substrate relative to a substrate chuck by contacting the substrate with a first protrusion of an engagement mechanism, the engagement mechanism being disposed adjacent the substrate chuck,
contacting a superstrate held by a superstrate chuck with the formable material, thereby forming a film of formable material between the superstrate and the substrate;
curing the film of formable material to form a cured layer between the superstrate and the substrate; and
initiating a separation front between the cured layer and the superstrate by contacting the superstrate with a second protrusion of the engagement mechanism,
wherein the substrate has an outer edge portion defining a notch, and
wherein the size and shape of the first protrusion is selected to engage within the notch.

2. The method of claim 1,
wherein positioning the substrate includes contacting the outer edge portion with the first protrusion.

3. The method of claim 2, further comprising rotating the substrate while contacting the outer edge portion with the first protrusion.

4. The method of claim 3, further comprising translating the substrate while contacting the outer edge portion with the first protrusion.

5. The method of claim 2, further comprising lowering the substrate onto one or more mounting pins while contacting the outer edge portion with the first protrusion.

6. The method of claim 5, wherein the second protrusion contacts the superstrate after passing though the notch.

7. The method of claim 1,
wherein initiating the separation front includes lifting the engagement mechanism such that the second protrusion passes through the notch without contacting the outer edge portion.

8. The method of claim 1, further comprising lifting the engagement mechanism to an elevated position prior to positioning the substrate.

9. The method of claim 1, further comprising lowering the engagement mechanism to a retracted position prior to contacting the superstrate with the formable material.

10. The method of claim 9, wherein, in the retracted position, the first protrusion and the second protrusion are located within a notch of the substrate chuck.

11. The method of claim 1, wherein the second protrusion overlaps the first protrusion in a direction perpendicular to a radial direction.

12. The method of claim 1, wherein the first protrusion has a first portion that extends farther in a direction perpendicular to a radial direction than a corresponding portion of the second protrusion.

13. The method of claim 1, further comprising:
carrying the substrate to the substrate chuck using a hand, wherein the hand includes at least one contact mechanism aligned with an end of the substrate.

14. The method of claim 13, wherein the at least one contact mechanism is a compliance pad.

15. The method of claim 14, wherein the compliance pad includes a spring-loaded plunger or a load cell.

16. The method of claim 1, further comprising, fully separating the superstrate from the cured layer after initiating the separation front.

17. A planarizing method, comprising:
dispensing formable material onto a substrate;
positioning the substrate relative to a substrate chuck by contacting the substrate with a first protrusion of an engagement mechanism, the engagement mechanism being disposed adjacent the substrate chuck,
contacting a superstrate held by a superstrate chuck with the formable material, thereby forming a film of formable material between the superstrate and the substrate;
curing the film of formable material to form a cured layer between the superstrate and the substrate; and
initiating a separation front between the cured layer and the superstrate by contacting the superstrate with a second protrusion of the engagement mechanism,
wherein the engagement mechanism comprises a body, and
wherein each of the first protrusion and the second protrusion extends from the body.

18. A method of manufacturing an article, comprising:
dispensing a formable material on a substrate;
positioning the substrate relative to a substrate chuck by contacting the substrate with a first protrusion of an engagement mechanism, the engagement mechanism being disposed adjacent the substrate chuck;
contacting a superstrate held by a superstrate chuck with the formable material, thereby forming a film of formable material between the superstrate and the substrate;
curing the film of formable material to form a cured layer between the superstrate and the substrate; and
initiating a separation front between the cured layer and the superstrate by contacting the superstrate with a second protrusion of the engagement mechanism;
fully separating the superstrate from the cured layer; and
processing the cured formable material to make the article, wherein the substrate has an outer edge portion defining a notch, and wherein the size and shape of the first protrusion is selected to engage within the notch.

19. A method of manufacturing an article, comprising:

dispensing a formable material on a substrate;

positioning the substrate relative to a substrate chuck by contacting the substrate with a first protrusion of an engagement mechanism, the engagement mechanism being disposed adjacent the substrate chuck;

contacting a superstrate held by a superstrate chuck with the formable material, thereby forming a film of formable material between the superstrate and the substrate;

curing the film of formable material to form a cured layer between the superstrate and the substrate; and initiating a separation front between the cured layer and the superstrate by contacting the superstrate with a second protrusion of the engagement mechanism;

fully separating the superstrate from the cured layer; and processing the cured formable material to make the article, wherein the engagement mechanism comprises a body, and wherein each of the first protrusion and a second protrusion extends from the body.

* * * * *